(12) United States Patent
Goto

(10) Patent No.: US 11,742,831 B2
(45) Date of Patent: *Aug. 29, 2023

(54) COUPLER AND CALCULATING DEVICE

(71) Applicant: KABUSHIKI KAISHA TOSHIBA, Tokyo (JP)

(72) Inventor: Hayato Goto, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/931,515

(22) Filed: Sep. 12, 2022

(65) Prior Publication Data
US 2023/0044874 A1 Feb. 9, 2023

Related U.S. Application Data

(62) Division of application No. 17/681,610, filed on Feb. 25, 2022, now Pat. No. 11,476,836.

(30) Foreign Application Priority Data

Jul. 30, 2021 (JP) ................................ 2021-125184

(51) Int. Cl.
*H03H 11/02* (2006.01)

(52) U.S. Cl.
CPC .......... *H03H 11/02* (2013.01); *Y10S 505/865* (2013.01)

(58) Field of Classification Search
CPC .. H03H 11/02; Y10S 505/864; Y10S 505/865
(Continued)

(56) References Cited

U.S. PATENT DOCUMENTS

2017/0085231 A1\* 3/2017 Abdo ...................... H03F 15/00
2019/0214971 A1   7/2019 Keane
(Continued)

FOREIGN PATENT DOCUMENTS

JP   2019-145010 A   8/2019
JP   2021-511657 A   5/2021

OTHER PUBLICATIONS

J. Martinis, "Abstract: P10.00001: Quantum supremacy using a programmable superconducting processor," APS March Meeting 2021, Session P10: Quantum Computing: Industry Session, https://meetings.aps.org/Meeting/MAR21/Session/P10.1 (Mar. 17, 2021).

(Continued)

*Primary Examiner* — William Hernandez
(74) *Attorney, Agent, or Firm* — Finnegan, Henderson, Farabow, Garrett & Dunner, LLP

(57) ABSTRACT

According to one embodiment, a coupler includes first to fourth capacitors, first and second inductors, and a first Josephson junction. The first capacitor includes a first capacitor end portion and a first capacitor other-end portion. The first inductor includes a first inductor end portion, and a first inductor other-end portion. The second inductor includes a second inductor end portion, and a second inductor other-end portion. The first Josephson junction includes a first Josephson junction end portion, and a first Josephson junction other-end portion. A space is surrounded with the first inductor, the second inductor, and the first Josephson junction. The third capacitor includes a third capacitor end portion, and a third capacitor other-end portion. The fourth capacitor includes a fourth capacitor end portion, and a fourth capacitor other-end portion.

20 Claims, 22 Drawing Sheets

(58) Field of Classification Search
USPC .................................................. 327/528, 594
See application file for complete search history.

(56) References Cited

U.S. PATENT DOCUMENTS

| | | |
|---|---|---|
| 2019/0266212 A1 | 8/2019 | Goto et al. |
| 2020/0320426 A1* | 10/2020 | Amin .................... H01L 39/025 |
| 2021/0182356 A1 | 6/2021 | Sakai et al. |
| 2021/0384896 A1* | 12/2021 | Mckay ................... H03K 17/92 |
| 2021/0408113 A1* | 12/2021 | Finck ...................... H01L 27/18 |
| 2022/0300844 A1* | 9/2022 | Stehlik .................. G06N 10/20 |
| 2022/0376161 A1* | 11/2022 | Goto ...................... G06N 10/40 |
| 2022/0399145 A1* | 12/2022 | Kirichenko ............. H01F 6/006 |

OTHER PUBLICATIONS

P. Mundada et a., "Abstract: X30.00013: Fast crosstalk-free perfect entangler in a tunable coupling superconducting circuit," APS March Meeting 2021, Session X30: Circuit Theory, Hamiltonian Analysis and Design Tools II, https://meetings.aps.org/Meeting/MAR21/Session/X30.13 (Mar. 19, 2021).

J. Stehlik et al., "Tunable Coupling Architecture for Fixed-frequency Transmons," arXiv:2101.07746v1,7 pages (Jan. 19, 2021).

\* cited by examiner

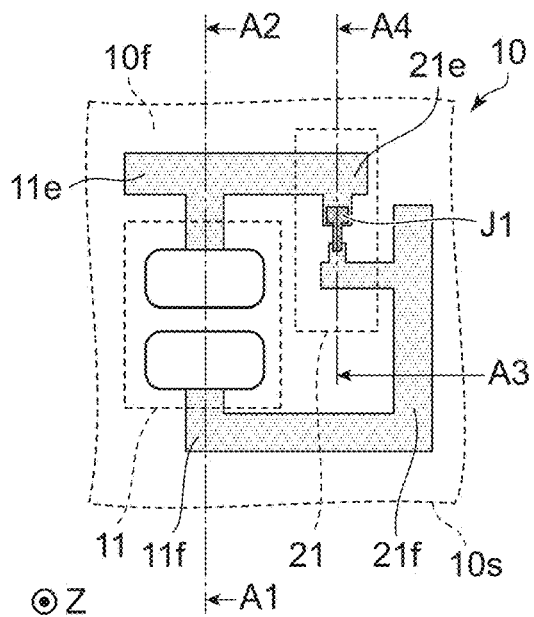
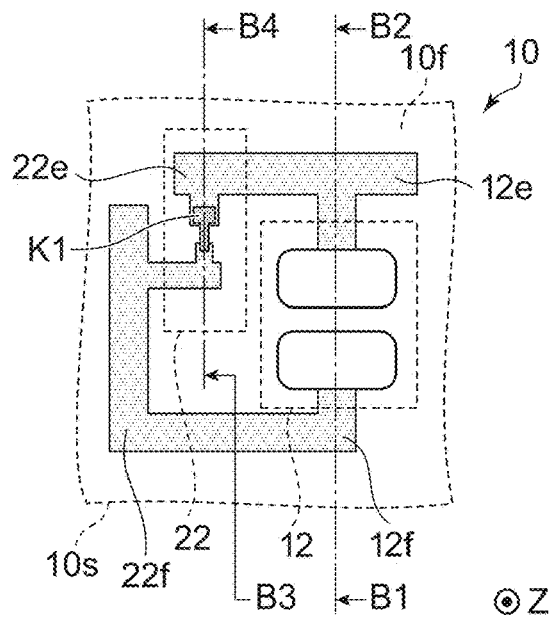
FIG. 16A  FIG. 16B
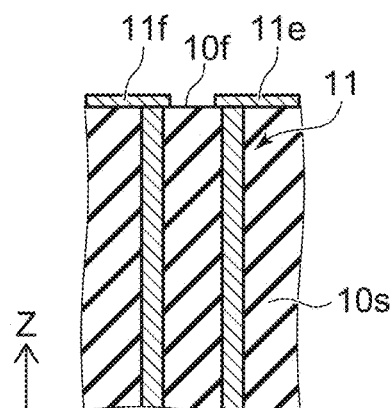
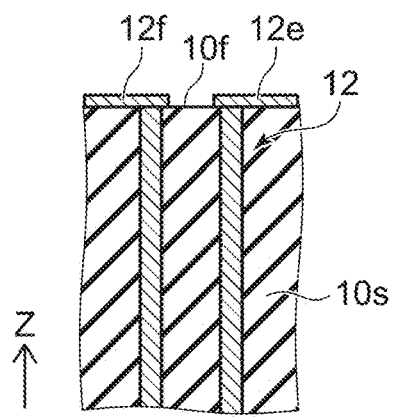
FIG. 16C  FIG. 16D
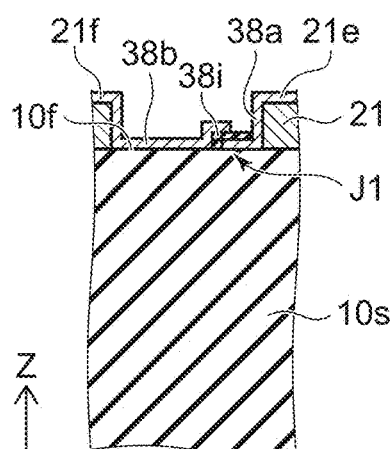
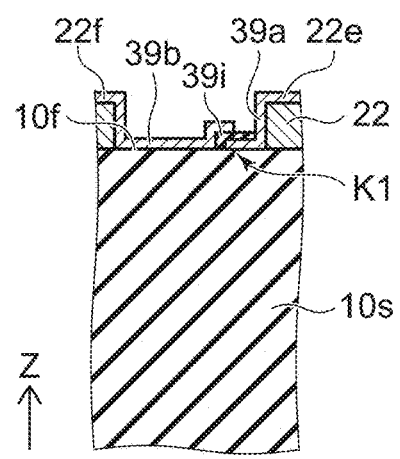
FIG. 16E  FIG. 16F

COUPLER AND CALCULATING DEVICE

CROSS-REFERENCE TO RELATED APPLICATIONS

This application is a divisional of U.S. patent application Ser. No. 17/681,610, filed Feb. 25, 2022, which is based upon and claims the benefit of priority from Japanese Patent Application No. 2021-125184, filed on Jul. 30, 2021; the entire contents of which are incorporated herein by reference.

FIELD

Embodiments described herein relate generally to a coupler and a calculating device.

BACKGROUND

For example, a coupler is used in a calculating device that utilizes multiple nonlinear resonators. It is desirable to improve the controllability of the calculating device.

BRIEF DESCRIPTION OF THE DRAWINGS

FIGS. 16A and 16B are schematic plan views illustrating portions of a coupler of one example according to the second embodiment, and FIGS. 16C to 16F are schematic cross-sectional views illustrating the portions of the coupler of the one example according to the second embodiment;

DETAILED DESCRIPTION

Figure 1:
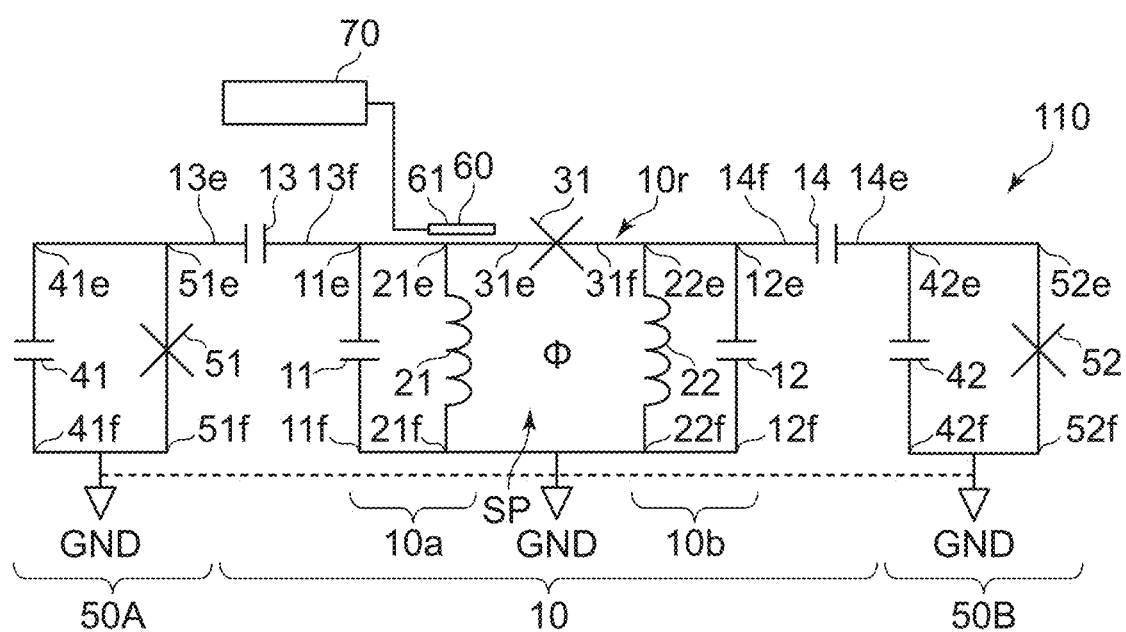
FIG. 1 is a schematic view illustrating a coupler and a calculating device according to a first embodiment.

According to one embodiment, a coupler includes a first capacitor, a second capacitor, a third capacitor, a fourth capacitor, a first inductor, a second inductor, and a first Josephson junction. The first capacitor includes a first capacitor end portion and a first capacitor other-end portion. The first inductor includes a first inductor end portion and a first inductor other-end portion. The first inductor end portion is electrically connected with the first capacitor end portion. The second capacitor includes a second capacitor end portion and a second capacitor other-end portion. The second inductor includes a second inductor end portion and a second inductor other-end portion. The second inductor end portion is electrically connected with the second capacitor end portion. The second inductor other-end portion is electrically connected with the first capacitor other-end portion, the first inductor other-end portion, and the second capacitor other-end portion. The first Josephson junction includes a first Josephson junction end portion and a first Josephson junction other-end portion. The first Josephson junction end portion is electrically connected with the first capacitor end portion. The first Josephson junction other-end portion is electrically connected with the second capacitor end portion. A space is surrounded with the first inductor, the second inductor, and the first Josephson junction. The third capacitor includes a third capacitor end portion and a third capacitor other-end portion. The third capacitor other-end portion is electrically connected with the first capacitor end portion. The third capacitor end portion is electrically connectable with a first nonlinear resonator. The fourth capacitor includes a fourth capacitor end portion and a fourth capacitor other-end portion. The fourth capacitor other-end portion is electrically connected with the second capacitor end portion. The fourth capacitor end portion is electrically connectable with a second nonlinear resonator.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating a coupler and a calculating device according to a first embodiment.

As shown in FIG. 1, the calculating device 110 according to the embodiment includes a coupler 10, a first nonlinear resonator 50A, and a second nonlinear resonator 50B. The coupler 10 couples the first nonlinear resonator 50A and the second nonlinear resonator 50B.

The coupler 10 includes a first capacitor 11, a second capacitor 12, a third capacitor 13, a fourth capacitor 14, a first inductor 21, a second inductor 22, and a first Josephson junction 31.

The first capacitor 11 includes a first capacitor end portion 11e and a first capacitor other-end portion 11f. The first inductor 21 includes a first inductor end portion 21e and a first inductor other-end portion 21f. The first inductor end portion 21e is electrically connected with the first capacitor end portion 11e.

The second capacitor 12 includes a second capacitor end portion 12e and a second capacitor other-end portion 12f. The second inductor 22 includes a second inductor end portion 22e and a second inductor other-end portion 22f. The second inductor end portion 22e is electrically connected with the second capacitor end portion 12e. The second inductor other-end portion 22f is electrically connected with the first capacitor other-end portion 11f, the first inductor other-end portion 21f, and the second capacitor other-end portion 12f. For example, the potentials of the first capacitor other-end portion 11f, the first inductor other-end portion 21f, the second capacitor other-end portion 12f, and the second inductor other-end portion 22f are set to a fixed potential (e.g., ground GND).

The first Josephson junction 31 includes a first Josephson junction end portion 31e and a first Josephson junction other-end portion 31f. The first Josephson junction end portion 31e is electrically connected with the first capacitor end portion 11e. The first Josephson junction end portion 31e also is electrically connected with the first inductor end portion 21e. The first Josephson junction other-end portion 31f is electrically connected with the second capacitor end portion 12e. The first Josephson junction other-end portion 31f also is electrically connected with the second inductor end portion 22e.

A space SP is surrounded with the first inductor 21, the second inductor 22, and the first Josephson junction 31. The space SP may be surrounded with the first capacitor 11, the second capacitor 12, and the first Josephson junction 31. For example, a loop 10r is formed from the first inductor 21, the second inductor 22, and the first Josephson junction 31. The loop 10r surrounds the space SP. As described below, a magnetic flux Φ inside the space SP (inside the loop 10r) is controllable.

The third capacitor 13 includes a third capacitor end portion 13e and a third capacitor other-end portion 13f. The third capacitor other-end portion 13f is electrically connected with the first capacitor end portion 11e. The third capacitor other-end portion 13f also is electrically connected with the first inductor end portion 21e and the first Josephson junction end portion 31e. The third capacitor end portion 13e is connectable with the first nonlinear resonator 50A.

The fourth capacitor 14 includes a fourth capacitor end portion 14e and a fourth capacitor other-end portion 14f. The fourth capacitor other-end portion 14f is electrically connected with the second capacitor end portion 12e. The fourth capacitor other-end portion 14f also is electrically connected with the second inductor end portion 22e and the first Josephson junction other-end portion 31f. The fourth capacitor end portion 14e is connectable with the second nonlinear resonator 50B.

In the coupler 10, a first part 10a that includes the first capacitor 11 and the first inductor 21 corresponds to a first LC circuit. A second part 10b that includes the second capacitor 12 and the second inductor 22 corresponds to a second LC circuit. These LC circuits are connected by the first Josephson junction 31. The magnetic flux Φ of the space SP that is surrounded with these components can be modulated.

The coupler 10 includes multiple modes (e.g., two modes). According to the embodiment, by providing the aforementioned LC circuits in the coupler 10, compared to when only inductors are included, the resonant frequencies of the aforementioned multiple modes can be reduced. For example, the resonant frequencies of the multiple modes of the coupler 10 can easily approach the resonant frequency of the first nonlinear resonator 50A and the resonant frequency of the second nonlinear resonator 50B. A strong coupling strength is obtained thereby. According to the embodiment, the controllability can be improved.

As described below, the coupling strength can be modified by controlling the magnetic flux Φ. For example, the coupling strength can be substantially zero, and the coupling can be decoupled (switched off). As described below, a two-qubit gate operation can be quickly performed by the control of the coupler 10. A coupler and a calculating device can be provided in which the controllability can be improved.

As shown in FIG. 1, the first nonlinear resonator 50A includes, for example, a first nonlinear resonator Josephson junction 51 and a first resonator capacitor 41. An end portion 51e of the first nonlinear resonator Josephson junction 51 and an end portion 41e of the first resonator capacitor 41 are electrically connected with the third capacitor end portion 13e. Another end portion 51f of the first nonlinear resonator Josephson junction 51 and another end portion 41f of the first resonator capacitor 41 are electrically connected to each other. For example, the potentials of the other end portions 51f and 41f are set to a fixed potential (e.g., the ground GND). Accordingly, for example, the other end portion 51f of the first nonlinear resonator Josephson junction 51 and the other end portion 41f of the first resonator capacitor 41 may be electrically connected with the first capacitor other-end portion 11f.

The end portion 51e of the first nonlinear resonator Josephson junction 51 and the end portion 41e of the first resonator capacitor 41 are capacitively coupled with the first part 10a via the third capacitor 13.

The second nonlinear resonator 50B includes, for example, a second nonlinear resonator Josephson junction 52 and a second resonator capacitor 42. An end portion 52e of the second nonlinear resonator Josephson junction 52 and an end portion 42e of the second resonator capacitor 42 are electrically connected with the fourth capacitor end portion 14e. Another end portion 52f of the second nonlinear resonator Josephson junction 52 and another end portion 42f of the second resonator capacitor 42 are electrically connected to each other. For example, the potentials of the other end portions 52f and 42f are set to a fixed potential (e.g., the ground GND). Accordingly, for example, the other end portion 52f of the second nonlinear resonator Josephson junction 52 and the other end portion 42f of the second resonator capacitor 42 may be electrically connected with the second capacitor other-end portion 12f.

The end portion 52e of the second nonlinear resonator Josephson junction 52 and the end portion 42e of the second resonator capacitor 42 are capacitively coupled with the second part 10b via the fourth capacitor 14.

The first nonlinear resonator 50A and the second nonlinear resonator 50B function as two qubits. Among the multiple energy levels included in the first and second nonlinear resonators 50A and 50B, it is possible to use the two lowest energy levels as the two states of the qubit. The two lowest energy levels of the multiple energy levels correspond to a ground state and a first excited state. The aforementioned two states of the qubits correspond to computational basis states. For example, the resonant frequency of the first nonlinear resonator 50A corresponds to a value of the energy difference between the two lowest energy states of the first nonlinear resonator 50A converted into a frequency. For example, the resonant frequency of the second nonlinear resonator 50B corresponds to a value of the energy difference between the two lowest energy states of the second nonlinear resonator 50B converted into a frequency. The energy can be converted into a frequency corresponding to the energy by dividing by Planck's constant h.

As shown in FIG. 1, the coupler 10 may include a first conductive member 61. The first conductive member 61 is configured to apply a magnetic field to the space SP (the loop 10r). For example, the magnetic field is generated by a current supplied to the first conductive member 61. The magnetic field that is generated is applied to the space SP (the loop 10r). As described below, the coupling strength between the first nonlinear resonator 50A and the second nonlinear resonator 50B changes according to the magnetic flux $\Phi$ in the space SP (the loop 10r) (the magnetic flux based on the magnetic field).

The first conductive member 61 is one example of a first magnetic field application part 60. As shown in FIG. 1, the calculating device 110 may include a controller 70. The coupler 10 (or the calculating device 110) may include the first magnetic field application part 60. The first magnetic field application part 60 is configured to apply a magnetic field to the space SP (the loop 10r). The controller 70 is configured to change the magnetic flux $\Phi$ in the space SP (the loop 10r) by controlling the first magnetic field application part 60. When the first magnetic field application part 60 includes the first conductive member 61, the controller 70 can change the magnetic flux $\Phi$ by modulating the current supplied to the first conductive member 61.

Figure 2A:
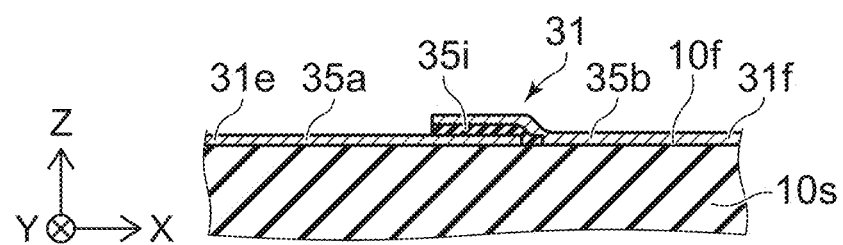
FIGS. 2A to 2C are schematic cross-sectional views illustrating portions of the coupler and the calculating device according to the first embodiment.
Figure 2B:
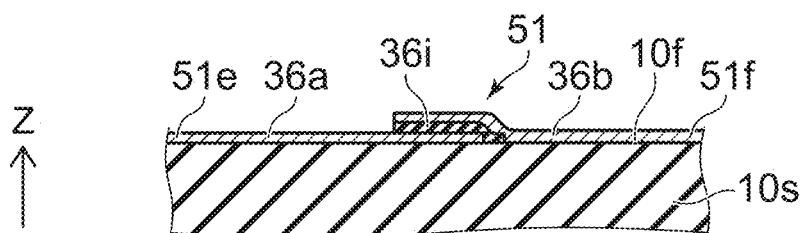
Figure 2C:
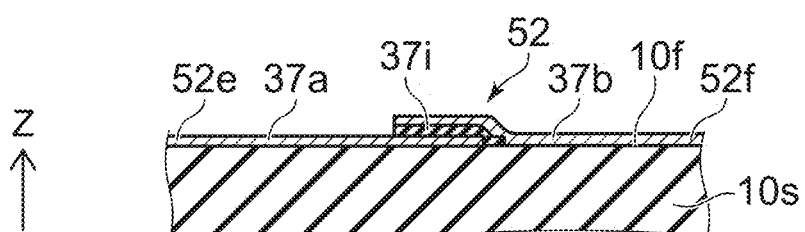

FIGS. 2A to 2C are schematic cross-sectional views illustrating portions of the coupler and the calculating device according to the first embodiment.

As shown in FIG. 2A, for example, the first Josephson junction 31 is located on a first surface 10f a base body 10s.

A direction perpendicular to the first surface 10f is taken as a Z-axis direction. One direction perpendicular to the Z-axis direction is taken as an X-axis direction. A direction perpendicular to the Z-axis direction and the X-axis direction is taken as a Y-axis direction.

As shown in FIG. 2A, the first Josephson junction 31 includes, for example, a conductive film 35a, a conductive film 35b, and an insulating film 35i. The insulating film 35i is located between a portion of the conductive film 35a and a portion of the conductive film 35b.

As shown in FIG. 2B, the first nonlinear resonator Josephson junction 51 includes, for example, a conductive film 36a, a conductive film 36b, and an insulating film 36i. The insulating film 36i is located between a portion of the conductive film 36a and a portion of the conductive film 36b.

As shown in FIG. 2C, the second nonlinear resonator Josephson junction 52 includes, for example, a conductive film 37a, a conductive film 37b, and an insulating film 37i. The insulating film 37i is located between a portion of the conductive film 37a and a portion of the conductive film 37b. These conductive films are substantially along the X-Y plane.

These conductive films include, for example, at least one selected from the group consisting of Al, Nb, NbN, TiN, NbTiN, and Ta. These materials are superconducting materials. These insulating films include, for example, at least one selected from the group consisting of $Al_2O_3$, $Nb_2O_5$, $Nb_2O_2$, NbO, and AlN. The base body 10s includes, for example, at least one selected from the group consisting of Si and sapphire. The base body 10s is, for example, insulative.

Figure 3A:
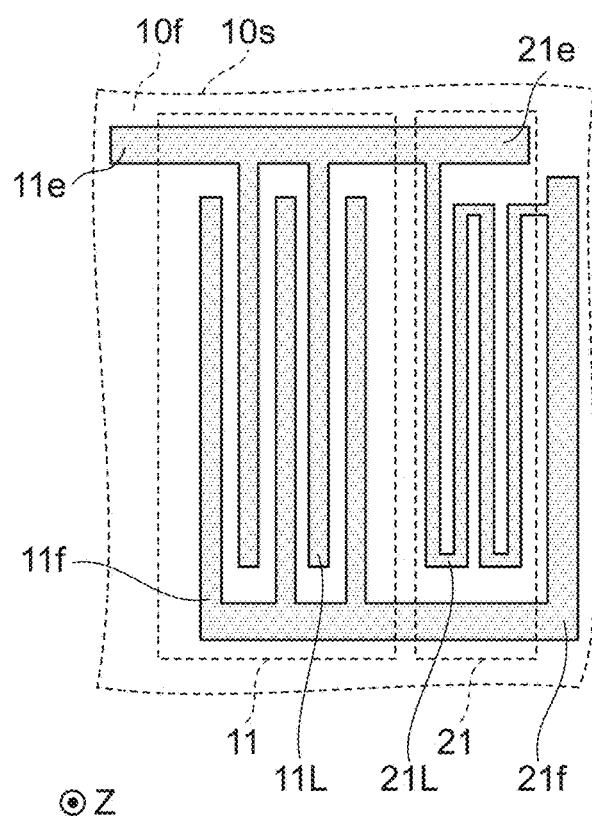
FIGS. 3A and 3B are schematic plan views illustrating portions of the coupler according to the first embodiment.
Figure 3B:
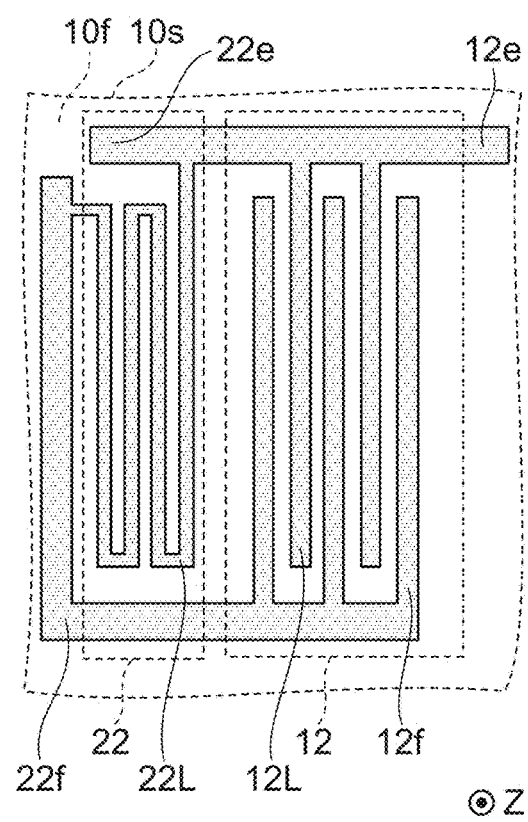

FIGS. 3A and 3B are schematic plan views illustrating portions of the coupler according to the first embodiment.

In one example as shown in FIG. 3A, the first capacitor 11 and the first inductor 21 are located on the first surface 10f of the base body 10s. The first capacitor 11 is formed of two conductive layers 11L that face each other. The first inductor 21 includes a first conductive layer 21L that has a meandering structure.

In one example as shown in FIG. 3B, the second capacitor 12 and the second inductor 22 are located on the first surface 10f of the base body 10s. The second capacitor 12 is formed of two conductive layers 12L that face each other. The second inductor 22 includes a second conductive layer 22L that has a meandering structure.

The conductive layers described above include, for example, Al, Nb, NbN, TiN, NbTiN, Ta, etc.

In these examples, for example, the first inductor 21 and the second inductor 22 are based on kinetic inductors. As described below, the first inductor 21 and the second inductor 22 may include Josephson junctions.

An example of simulation results of characteristics of the coupler 10 (and the calculating device 110) will now be described. The inductances of the first and second inductors 21 and 22 are 2.34 nH in the model of the following simulation. The critical current of the first Josephson junction 31 is 40 nA. The capacitances of the first and second capacitors 11 and 12 are 39 fF. The capacitances of the third and fourth capacitors 13 and 14 are 9.74 fF. The critical current of the first nonlinear resonator Josephson junction 51 is 70 nA. The critical current of the second nonlinear resonator Josephson junction 52 is 50 nA. The capacitances of the first and second resonator capacitors 41 and 42 are 39 fF. For example, the magnetic flux $\Phi$ of the space SP (the loop 10r) can be changed by controlling the current supplied to the first conductive member 61.

Characteristics related to the calculating device 110 according to the embodiment and characteristics related to a calculating device 119a of a first reference example will now be described. As described above, the coupler 10 includes LC circuits in the calculating device 110. In the calculating device 119a of the first reference example, the coupler 10 does not include the first capacitor 11 and the second capacitor 12. In other words, in the calculating device 119a, the first part 10a includes the first inductor 21 but does not include the first capacitor 11. In the calculating device 119a, the second part 10b includes the second inductor 22 but does not include the second capacitor 12. Otherwise, the configuration of the calculating device 119a is similar to the calculating device 110.

Figure 4A:
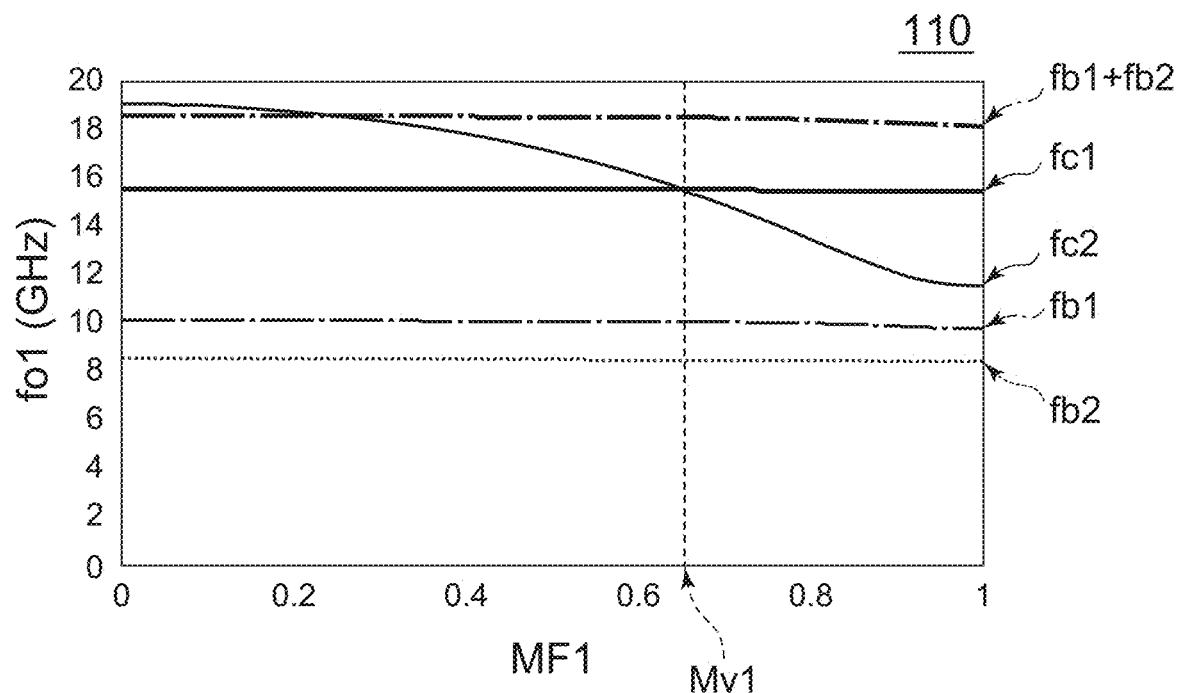
FIGS. 4A and 4B are graphs illustrating frequencies of couplers and calculating devices.
Figure 4B:
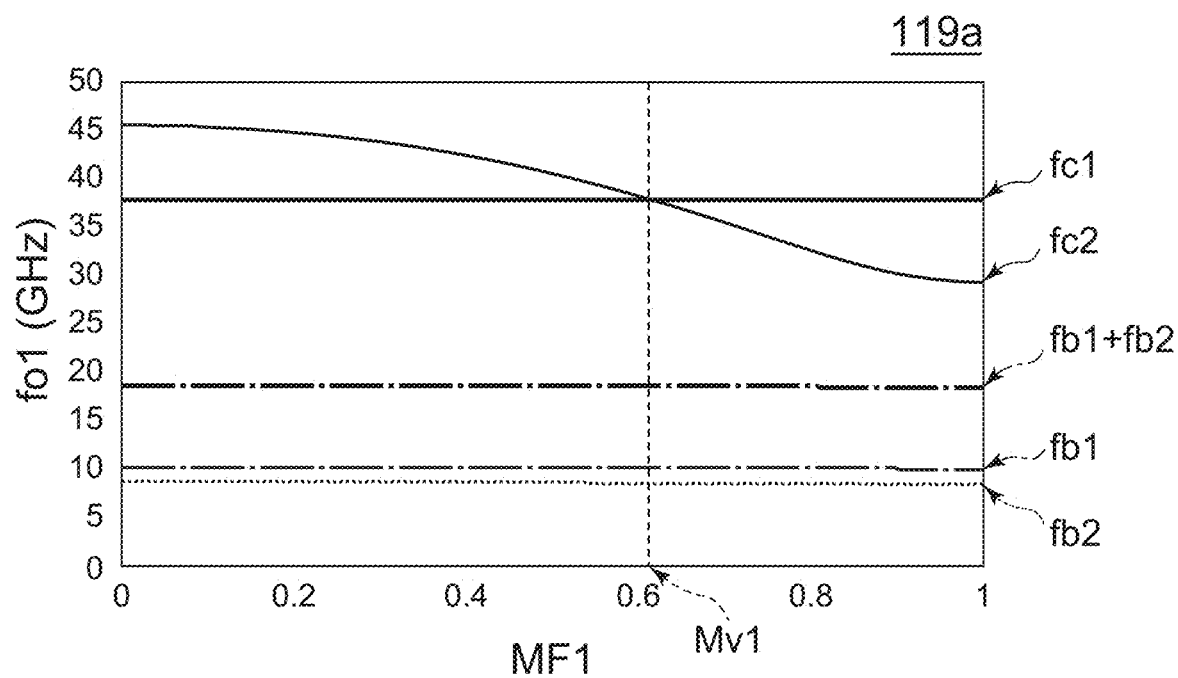

FIGS. 4A and 4B are graphs illustrating the frequencies of the couplers and the calculating devices.

FIG. 4A corresponds to the calculating device 110 according to the embodiment. FIG. 4B corresponds to the calculating device 119a of the first reference example. In these figures, the horizontal axis is a magnetic flux MF1 of the space SP (the loop 10r). The magnetic flux MF1 ($=2\Phi/\Phi_0$ is normalized by a reduced flux quantum $\Phi_0$ and is dimensionless. In these figures, the vertical axis corresponds to a frequency fol. These figures illustrate a resonant frequency fb1 of the first nonlinear resonator 50A and a resonant frequency fb2 of the second nonlinear resonator 50B. The first nonlinear resonator 50A corresponds to, for example, a first qubit. The second nonlinear resonator 50B corresponds to, for example, a second qubit. As described above, the resonant frequency of each nonlinear resonator corresponds to the value of the energy difference between the two lowest energy states of the nonlinear resonator converted into a frequency.

FIGS. 4A and 4B illustrate a frequency fc1 and a frequency fc2. The frequency fc1 corresponds to one frequency of the multiple modes (e.g., the two modes) of the coupler 10. The frequency fc2 corresponds to another frequency of the multiple modes (e.g., the two modes) of the coupler 10.

In the calculating device 110 according to the embodiment as shown in FIG. 4A, the frequency fc1 and the frequency fc2 change as the magnetic flux MF1 changes. In particular, the frequency fc2 greatly changes. In the example, the frequency fc1 and the frequency fc2 approach each other when the magnetic flux MF1 is about 0.66. In the example, the frequency fc2 is equal to the frequency fc1 at a first magnetic flux value Mv1. The first magnetic flux value Mv1 is about 0.66. In the example, the range of the frequencies fc1 and fc2 is not lower than 11 GHz and not more than 19 GHz.

As shown in FIG. 4A, the resonant frequency fb1 of the first nonlinear resonator 50A and the resonant frequency fb2 of the second nonlinear resonator 50B are substantially constant as the magnetic flux MF1 changes. In the example, the resonant frequency fb1 of the first nonlinear resonator 50A is about 10.0 GHz. The resonant frequency fb2 of the second nonlinear resonator 50B is about 8.4 GHz. An example of the amount of the change of the resonant frequencies fb1 and fb2 as the magnetic flux MF1 changes is described below.

Thus, according to the embodiment, the frequency fc1 and the frequency fc2 are relatively near the resonant frequencies fb1 and fb2. The coupler 10 includes multiple modes (at least two modes). In other words, the coupler 10 can resonate in multiple modes. At least two of the resonant frequencies (the frequency fc1 and the frequency fc2) of the multiple modes are higher than the resonant frequencies fb1 and fb2 and lower than the sum of the resonant frequency fb1 and the resonant frequency fb2 at the vicinity of the first magnetic flux value Mv1 described above (the magnetic flux value at which the frequencies fc1 and fc2 are near each other). According to the embodiment, a state exists in which the resonant frequencies (the frequency fc1 and the frequency fc2) of the multiple modes are lower than the sum of the resonant frequency fb1 and the resonant frequency fb2.

According to the embodiment, the first part 10a and the second part 10b each include an inductor and a capacitor. Therefore, the resonant frequencies of the multiple modes of the coupler 10 can approach the resonant frequencies of the nonlinear resonators. For example, a strong coupling strength is obtained thereby. A coupler and a calculating device can be provided in which the controllability can be improved.

As shown in FIG. 4B, in the calculating device 119a of the first reference example, the resonant frequencies (the frequency fc1 and the frequency fc2) of the multiple modes of the coupler 10 are markedly higher than the resonant frequencies (the resonant frequency fb1 and the resonant frequency fb2) of the two nonlinear resonators. In the calculating device 119a as shown in FIG. 4B, the frequency fc1 and the frequency fc2 are higher than the sum of the resonant frequency fb1 and the resonant frequency fb2. Therefore, it is difficult to obtain a high coupling strength. In the first reference example, for example, the resonant frequencies of the multiple modes of the coupler 10 are not less than 3 times the resonant frequencies of the nonlinear resonators.

According to the embodiment, it is favorable for the capacitances of the first and second capacitors 11 and 12 to be large enough not to be negligible; for example, the capacitances of the first and second capacitors 11 and 12 are greater than 0.1 times the capacitances of the third and fourth capacitors 13 and 14. For example, the resonant frequencies (the frequency fc1 and the frequency fc2) of the multiple modes can be effectively reduced thereby.

According to the embodiment as shown in FIG. 4A, the resonant frequency fb1 of the first nonlinear resonator 50A and the resonant frequency fb2 of the second nonlinear resonator 50B are substantially constant with respect to the change of the magnetic flux MF1. For example, the frequencies of the two qubits substantially do not change. The frequencies of the two qubits are substantially fixed and are stable. A coupler and a calculating device can be provided in which the controllability can be improved.

Figure 5A:
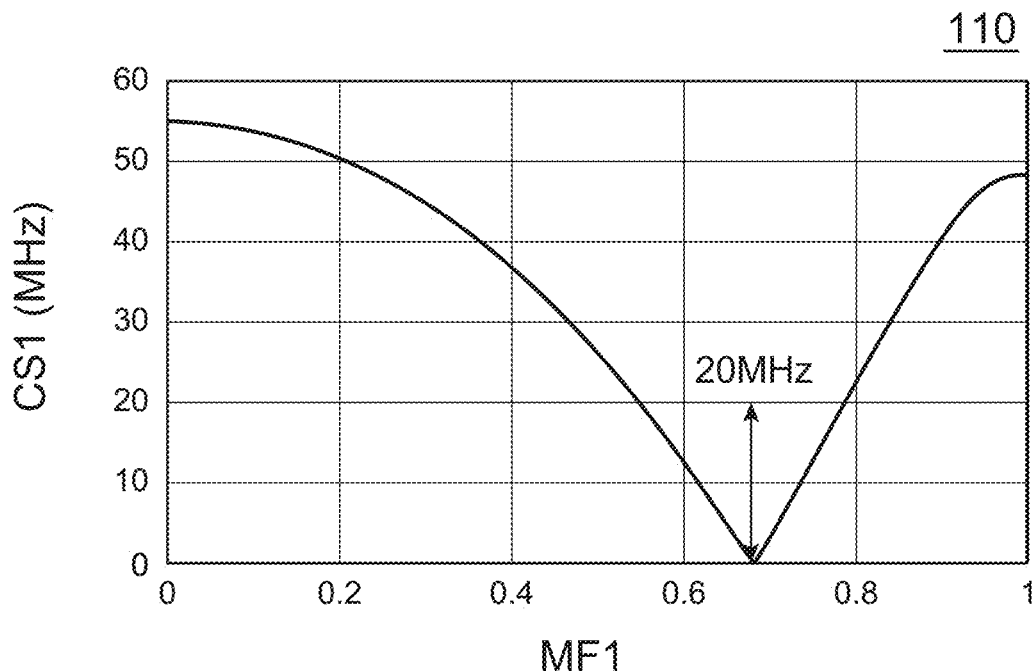
FIGS. 5A and 5B are graphs illustrating coupling strengths of the couplers and the calculating devices.
Figure 5B:
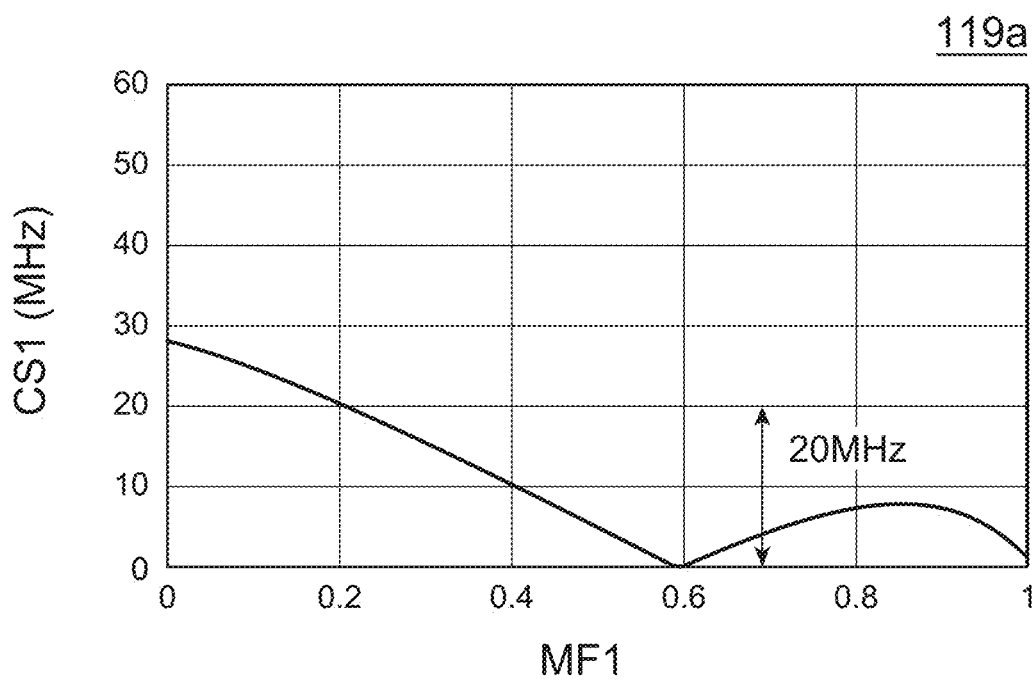

FIGS. 5A and 5B are graphs illustrating coupling strengths of the couplers and the calculating devices.

FIG. 5A corresponds to the calculating device 110 according to the embodiment. FIG. 5B corresponds to the calculating device 119a of the first reference example described above. In these figures, the horizontal axis is the magnetic flux MF1 of the space SP (the loop 10r). The vertical axis is a coupling strength CS1.

As shown in FIG. 5A, the coupling strength CS1 changes as the magnetic flux MF1 changes. The coupling strength CS1 can be controlled by controlling the magnetic flux MF1. For example, the width of the change of the coupling strength CS1 is about 20 MHz. In other words, the coupling strength CS1 can be adjusted in a range of −20 MHz to 20 MHz.

Thus, the controller 70 can change the coupling strength CS1 between the first nonlinear resonator 50A and the second nonlinear resonator by controlling the magnetic flux $\Phi$ (the magnetic flux MF1) of the space SP.

In the example as shown in FIG. 5A, the coupling strength CS1 is substantially 0 when the magnetic flux MF1 is about 0.68. Thus, the controller 70 can substantially decouple the first nonlinear resonator 50A from the second nonlinear resonator 50B by controlling the magnetic flux Φ (the magnetic flux MF1) of the space SP. In other words, the coupling can be switched off. A coupler and a calculating device can be provided in which the controllability can be improved.

As shown in FIG. 5B, in the calculating device 119*a* of the first reference example as well, a condition exists at which the coupling strength CS1 is substantially 0. However, in the calculating device 119*a*, the magnetic flux MF1 when the coupling strength CS1 is not 0 is less than that of the calculating device 110. Thus, it is difficult to obtain a high coupling strength CS1 in the first reference example in which the capacitors are not included in the first and second parts 10*a* and 10*b*. According to the embodiment, a high coupling strength CS1 can be obtained, and the coupling can be switched off.

Figure 6A:
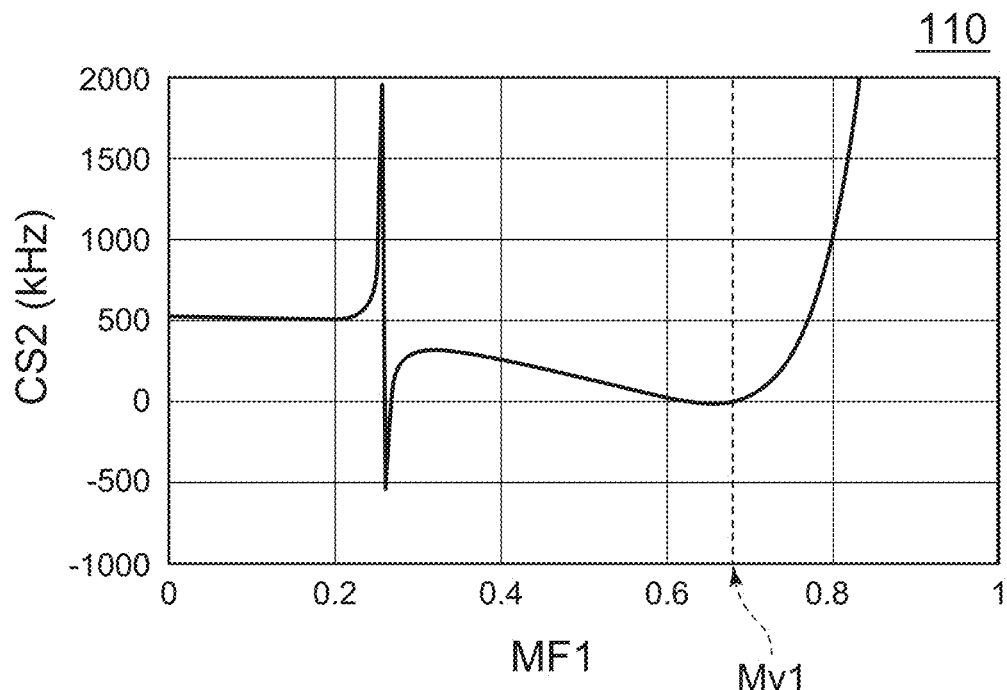
FIGS. 6A and 6B are graphs illustrating characteristics of the couplers and the calculating devices.
Figure 6B:
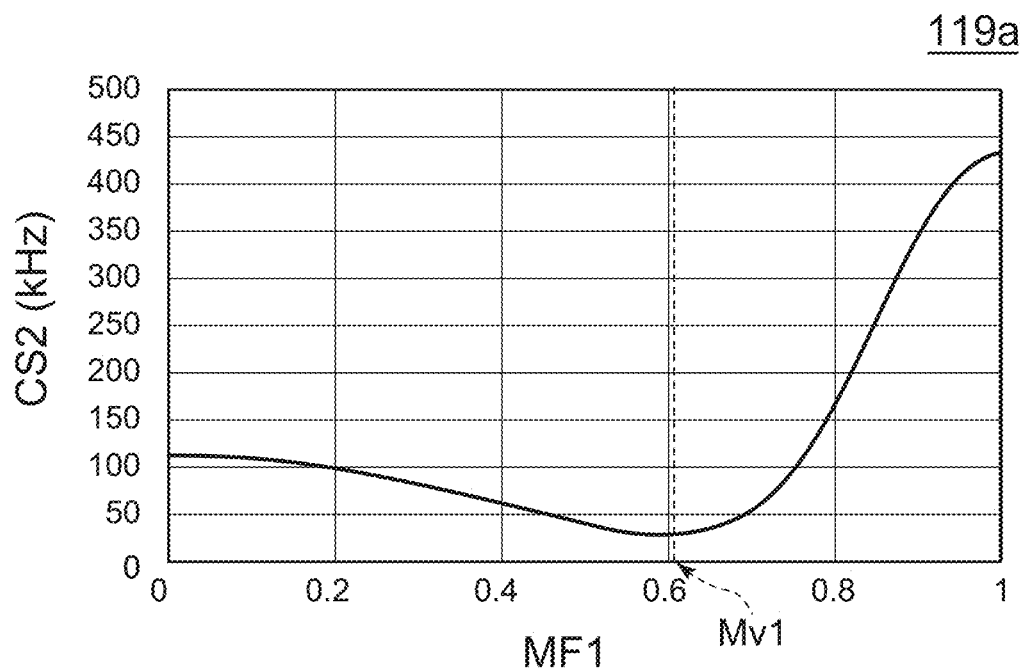

FIGS. 6A and 6B are graphs illustrating characteristics of the couplers and the calculating devices.

FIG. 6A corresponds to the calculating device 110 according to the embodiment. FIG. 6B corresponds to the calculating device 110*a* of the first reference example. In these figures, the horizontal axis is the magnetic flux MF1. In these figures, the vertical axis is a coupling strength CS2 related to residual coupling (so-called ZZ-coupling). ZZ-coupling corresponds to the state in which fb1+fb2−fb3 is nonzero due to the residual coupling, wherein the frequency fb3 corresponds to both the two qubits being in the "1 state". The ZZ-coupling "shift" corresponds to the coupling strength CS2.

As described with reference to FIG. 4A, the coupling strength CS1 is substantially zero when the magnetic flux MF1 is about 0.68 (the first magnetic flux value Mv1). As shown in FIG. 6A, the coupling strength CS2 that is related to the residual coupling can be substantially zero when the magnetic flux MF1 is about 0.68. For example, robust zero ZZ-coupling is obtained.

On the other hand, in the calculating device 119*a* of the first reference example as shown in FIG. 6B, the coupling strength CS2 that is related to the residual coupling cannot be reduced and is not 0.

In the first reference example in which capacitors are not included in the first and second parts 10*a* and 10*b*, it is necessary to excessively increase the frequencies fc1 and fc2 to reduce the coupling strength CS2 related to the residual coupling; as a result, the coupling strength CS1 becomes markedly low. In the first reference example, it is difficult to obtain a high coupling strength CS1 while setting the coupling strength CS2 to zero.

A second reference example and a third reference example will now be described. In the second and third reference examples as well, capacitors are not included in the first and second parts 10*a* and 10*b*. In the second reference example, the values of the inductors are adjusted to obtain a high coupling strength CS1. In the third reference example, the values of the inductors are adjusted to reduce the coupling strength CS2 related to the residual coupling.

Figure 7A:
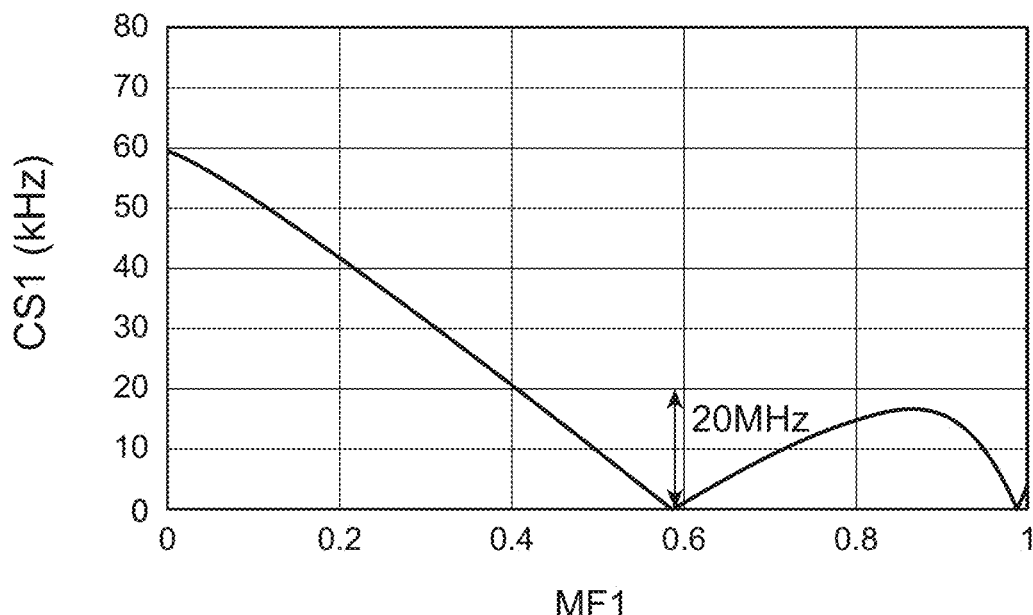
FIGS. 7A and 7B are graphs illustrating coupling strength and characteristic of a coupler and a calculating device of a second reference example.
Figure 7B:
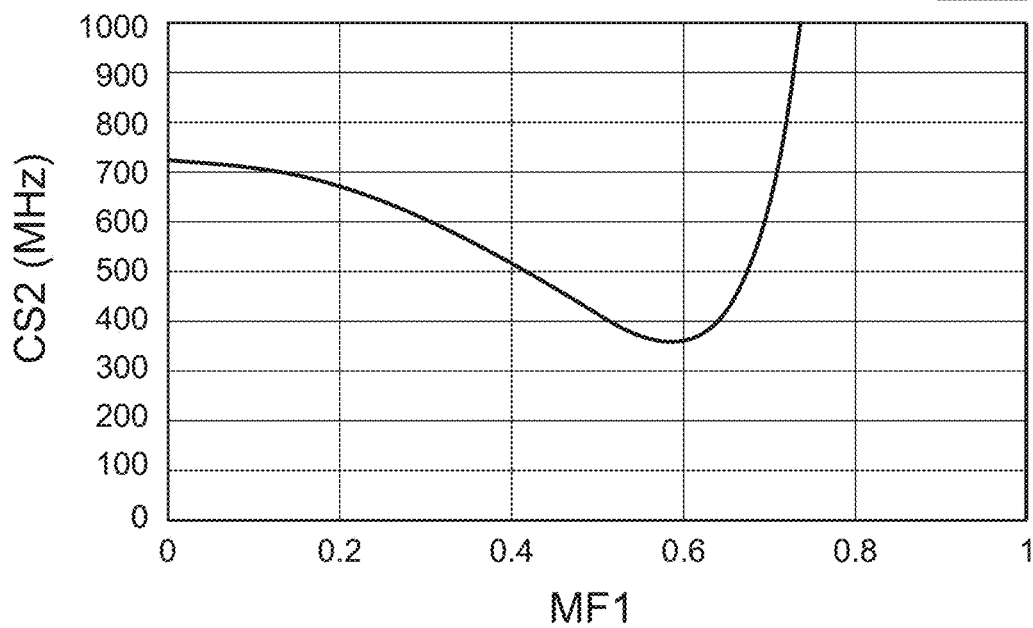

FIGS. 7A and 7B are graphs illustrating coupling strength and characteristic of the coupler and the calculating device of the second reference example.

These figures correspond to the calculating device 119*b* according to the second reference example. In the example of the second reference example, the inductances of the first and second inductors 21 and 22 are 4.1 nH. In FIGS. 7A and 7B, the horizontal axis is the magnetic flux MF1 of the space SP (the loop 10*r*). The vertical axis of FIG. 7A is the coupling strength CS1. The vertical axis of FIG. 7B is the coupling strength CS2 that is related to the residual coupling.

In the second reference example as shown in FIG. 7A, a condition exists at which the coupling strength CS1 is substantially zero (the coupling is off). Compared to the first reference example, a high coupling strength CS1 is obtained in the second reference example. However, in the second reference example as shown in FIG. 7B, the coupling strength CS2 is large compared to that of the first reference example, and is not 0. Thus, in the second reference example, a low coupling strength CS2 cannot be obtained.

Figure 8A:
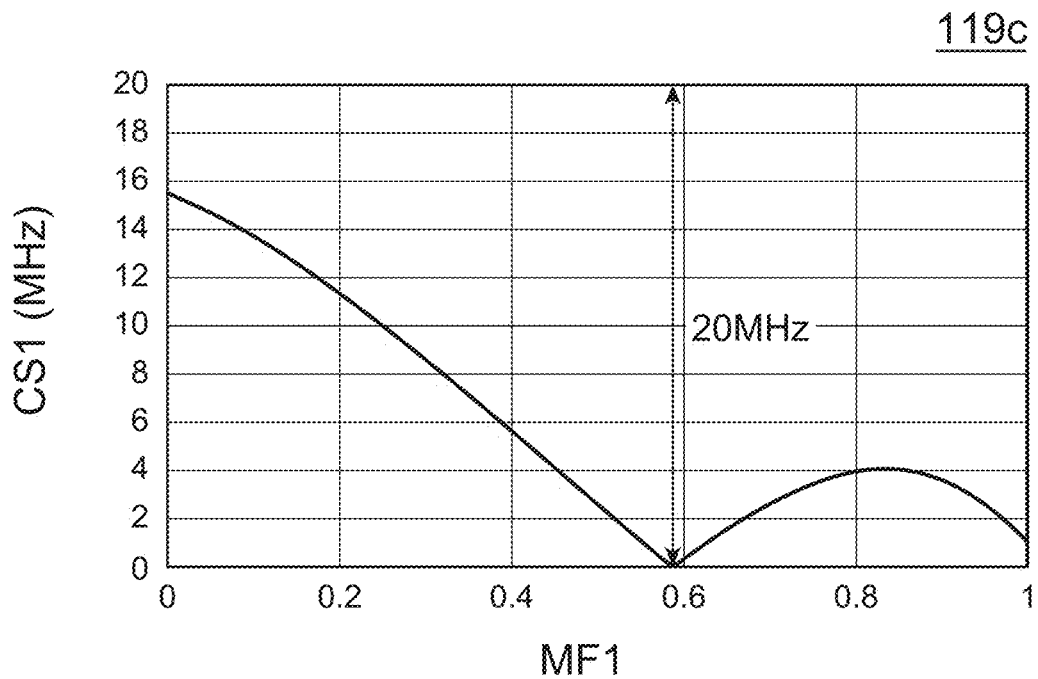
FIGS. 8A and 8B are graphs illustrating coupling strength and characteristic of a coupler and a calculating device of a third reference example.
Figure 8B:
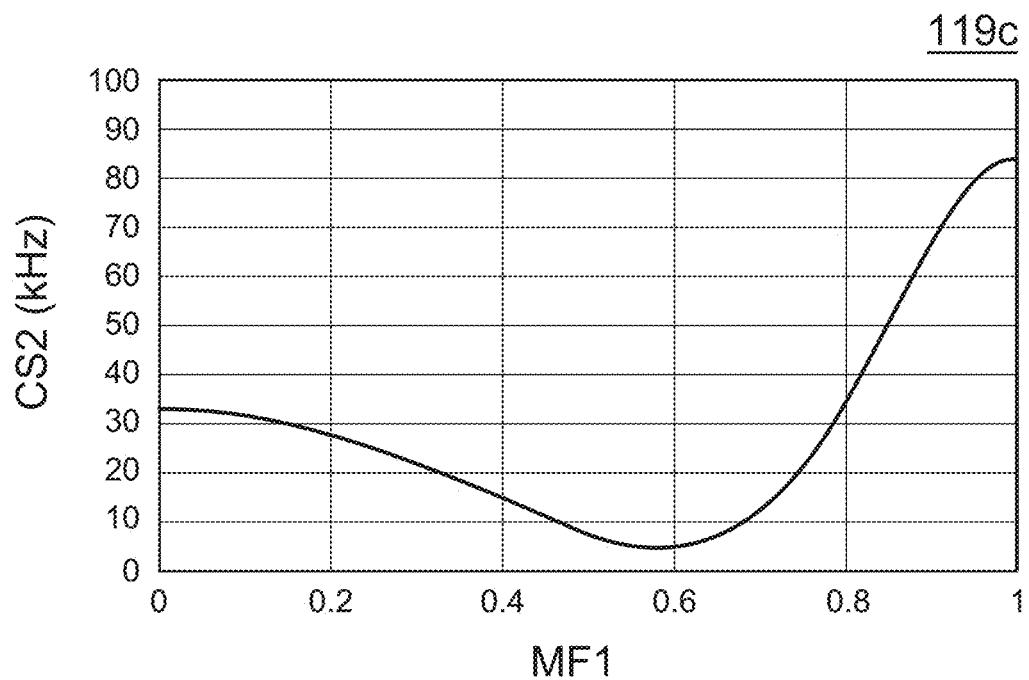

FIGS. 8A and 8B are graphs illustrating coupling strength and characteristic of the coupler and the calculating device of the third reference example.

These figures correspond to the calculating device 119*c* according to the third reference example. In the example of the third reference example, the inductances of the first and second inductors 21 and 22 are 1.63 nH. In FIGS. 8A and 8B, the horizontal axis is the magnetic flux MF1 of the space SP (the loop 10*r*). The vertical axis of FIG. 8A is the coupling strength CS1. The vertical axis of FIG. 8B is the coupling strength CS2 that is related to the residual coupling.

In the third reference example as shown in FIG. 8A, a condition exists at which the coupling strength CS1 is substantially zero (the coupling is off). In the third reference example, the coupling strength CS1 is markedly low. In the third reference example as shown in FIG. 8B, compared to the first reference example, the coupling strength CS2 becomes low but is substantially nonzero.

As described above, the first to third reference examples in which capacitors are not included in the first and second parts 10*a* and 10*b* cannot simultaneously obtain a coupling strength CS2 that is substantially zero, a high coupling strength CS1, and coupling that can be switched off.

According to the embodiment, capacitors are included in the first and second parts 10*a* and 10*b*. A coupling strength CS2 that is substantially zero, a high coupling strength CS1, and coupling that can be switched off are obtained thereby.

The element size increases when capacitors are included in the first and second parts 10*a* and 10*b*. Therefore, generally, the inclusion of capacitors in the first and second parts 10*a* and 10*b* is avoided.

Conversely, according to the embodiment as described above, capacitors are included in the first and second parts 10*a* and 10*b*. For example, a coupling strength CS2 that is substantially zero, a high coupling strength CS1, and coupling that can be switched off are obtained thereby. This is a special effect according to the embodiment. Such an effect is conventionally-unknown. This special effect was first discovered by fully quantum-mechanical analysis performed by the inventor of the application.

An example of characteristics related to a two-qubit gate operation will now be described. For example, the magnetic flux MF1 is set to a value (the first magnetic flux value Mv1 described above that is about 0.68) such that the coupling strength CS1 is zero when the two-qubit gate operation is not performed. The magnetic flux MF1 is modulated when performing the two-qubit gate operation. The frequency of the modulation is the difference between the resonant frequency fb1 and the resonant frequency fb2, and in the example, is about 1.55 GHz; the amplitude of the modulation of the simulation is 0.12. In other words, the magnetic flux MF1 oscillates with a sinusoidal waveform between 0.56 to 0.80.

Figure 9:
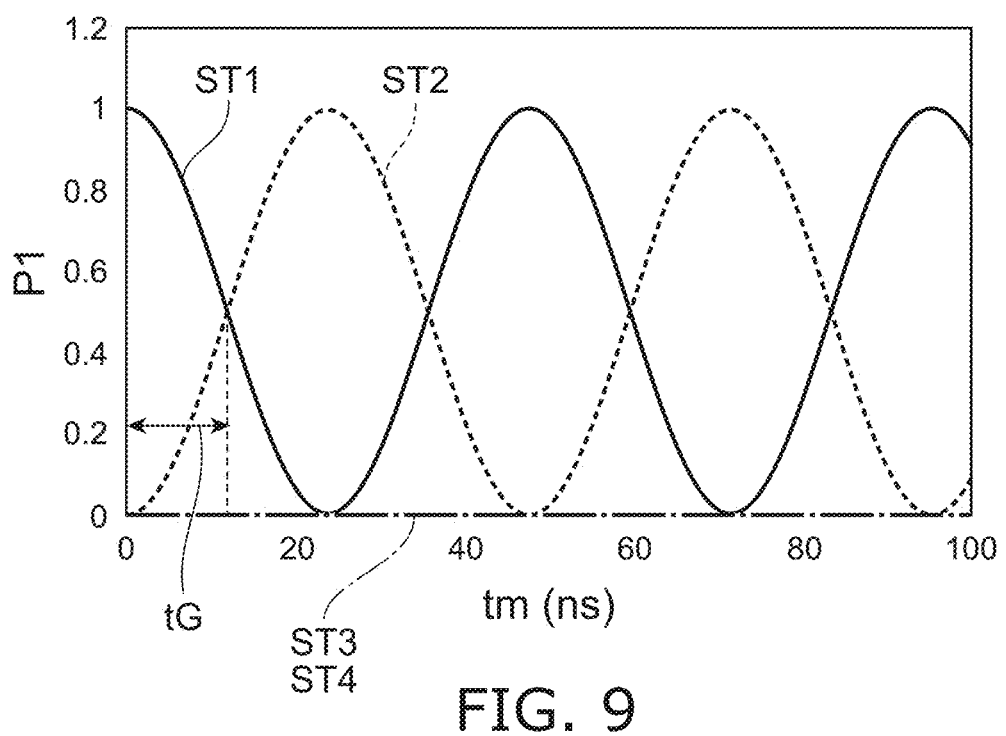
FIG. 9 is a graph illustrating the probability of the coupler and the calculating device according to the first embodiment.

FIG. 9 is a graph illustrating a probability of the coupler and the calculating device according to the first embodiment. The horizontal axis of FIG. 9 is time tm. The vertical axis is a probability P1.

FIG. 9 illustrates the probability P1 of first to fourth states ST1 to ST4. In the first state ST1, for example, the first nonlinear resonator 50A is "1", and the second nonlinear resonator 50B is "0". In the second state ST2, for example, the first nonlinear resonator 50A is "0", and the second nonlinear resonator 50B is "1". In the third state ST3, for example, the first nonlinear resonator 50A is "1", and the second nonlinear resonator 50B is "1". In the fourth state ST4, for example, the first nonlinear resonator 50A is "0", and the second nonlinear resonator 50B is "0".

As shown in FIG. 9, when the time tm is 0, the probability P1 of the first state ST1 is 1, and the probability P1 of the second state ST2 is 0. The probability P1 of the first state ST1 and the probability P1 of the second state ST2 change as the time tm elapses. In the example, the probability P1 of the first state ST1 is equal to the probability P1 of the second state ST2 when the time tm is about 12 ns. The probability P1 of the first state ST1 drops below the probability P1 of the second state ST2 as the time tm exceeds about 12 ns. In the example, the two-qubit gate operation can be completed at a time tm of 12 ns.

According to the embodiment, a short gating time tG is obtained. A two-qubit gate can be quickly performed. A coupler and a calculating device can be provided in which the controllability can be improved. The gating time tG is, for example, not less than 10 ns and not more than about 20 ns.

Thus, according to the embodiment, the two-qubit gate operation for the first and second nonlinear resonators 50A and 50B is performed by modulating the magnetic flux MF1 (the magnetic flux Φ) at an appropriate frequency. In the period in which the magnetic flux MF1 is not modulated, the coupling remains off (the coupling strength CS1 and the coupling strength CS2 are substantially zero).

As shown in FIG. 9, the probability P1 of the third state ST3 and the probability P1 of the fourth state ST4 are substantially 0. A stable two-qubit gate is possible.

Figure 10A:
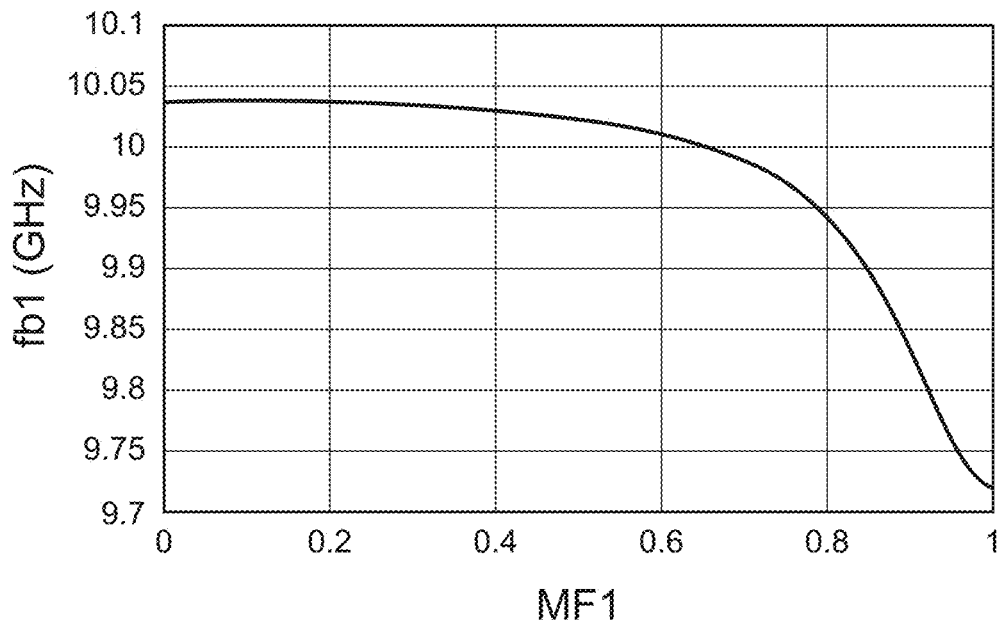
FIGS. 10A and 10B are graphs illustrating resonant frequencies of the coupler and the calculating device according to the first embodiment.
Figure 10B:
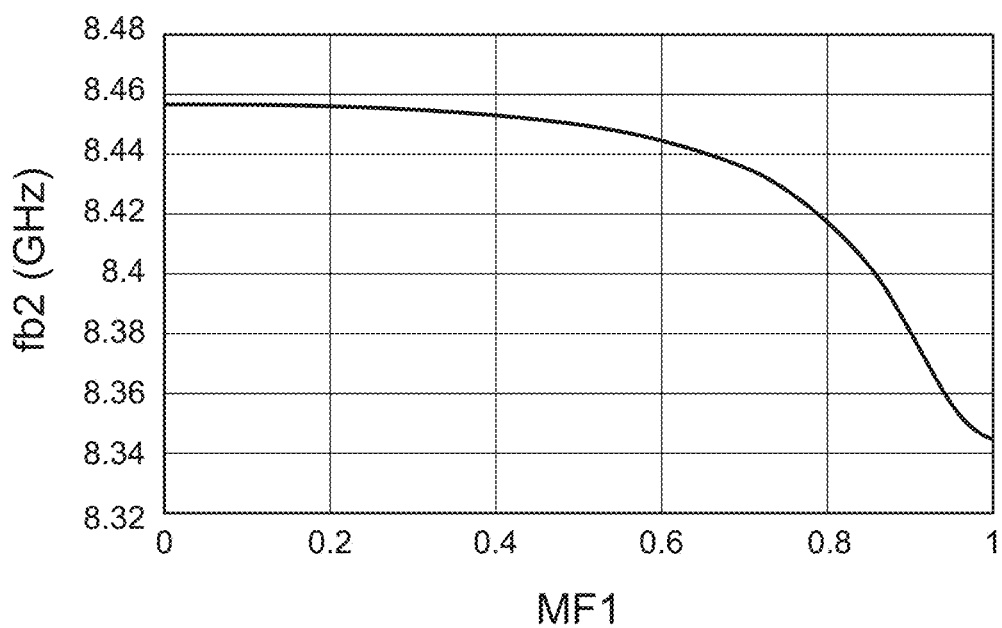

FIGS. 10A and 10B are graphs illustrating resonant frequencies of the coupler and the calculating device according to the first embodiment.

The horizontal axis of these figures is the magnetic flux MF1. The vertical axis of FIG. 10A is the resonant frequency fb1 of the first nonlinear resonator 50A. The vertical axis of FIG. 10B is the resonant frequency fb2 of the second nonlinear resonator 50B.

As shown in FIG. 10A, the resonant frequency fb1 of the first nonlinear resonator 50A changes at the vicinity of about 10 GHz when the magnetic flux MF1 is changed from 0 to 1. The change amount (the change magnitude) of the resonant frequency fb1 is about 300 MHz.

As shown in FIG. 10B, the resonant frequency fb2 of the second nonlinear resonator 50B changes at the vicinity of about 8.4 GHz when the magnetic flux MF1 is changed from 0 to 1. The change amount (the change magnitude) of the resonant frequency fb2 is about 100 MHz.

Thus, according to the embodiment, the changes of the resonant frequencies of the nonlinear resonators can be suppressed when the magnetic flux MF1 is changed. The frequencies of the qubits are stable. The frequencies of the qubits can be substantially fixed. A coupler and a calculating device can be provided in which the controllability can be improved.

According to the embodiment, for example, a high coupling strength CS1 is obtained. For example, a fast two-qubit gate operation is possible. For example, the coupling of the multiple nonlinear resonators can be switched off while obtaining a high coupling strength CS1. The frequency change of the nonlinear resonators (the qubits) due to the magnetic flux is small; and the stability of the qubits is maintained. According to the embodiment, for example, a coupler and a calculating device can be provided in which the controllability can be improved.

For example, a fourth reference example may be considered in which two qubits of different frequencies are directly coupled, and a two-qubit gate is performed by irradiating a microwave. In the fourth reference example, the microwave of the frequency of one of the two qubits is irradiated on the other of the two qubits. In the fourth reference example, the characteristics are dependent on higher-order perturbation terms. High-speed gating is difficult in the fourth reference example.

For example, a fifth reference example may be considered in which two qubits of different frequencies are directly coupled, and a two-qubit gate is performed by irradiating a microwave. In the fifth reference example, the microwave that corresponds to the difference between the frequencies of the two qubits is irradiated. In the fifth reference example as well, the characteristics are dependent on higher-order perturbation terms. In the fifth reference example as well, high-speed gating is difficult.

Conversely, according to the embodiment, high-speed gating is possible by using the coupler 10 described above.

For example, the frequency of the "−mode" of the coupler 10 corresponds to the frequency fc2 described above. According to the embodiment, the frequency of the "−mode" is adjusted using the magnetic flux Φ inside the loop 10r. Thereby, the on and off switching of the coupling is possible. Coupling can be substantially completely off even when the difference between the frequencies of the two qubits is large. The coupling can be switched off even though the coupling strength is high. A higher speed also is possible. A coupler and a calculating device can be provided in which the controllability can be improved.

In one example according to the embodiment, for example, the capacitance of the first capacitor 11 is greater than 0.1 times the capacitance of the first resonator capacitor 41. For example, the capacitance of the second capacitor 12 is greater than 0.1 times the capacitance of the second resonator capacitor 42. The frequency of the coupler 10 is easily reduced thereby.

In one example according to the embodiment, for example, the capacitance of the third capacitor 13 is greater than 0.1 times the capacitance of the first resonator capacitor 41. For example, the capacitance of the fourth capacitor 14 is greater than 0.1 times the capacitance of the second resonator capacitor 42. The frequency of the coupler 10 is easily reduced thereby.

Figure 11:
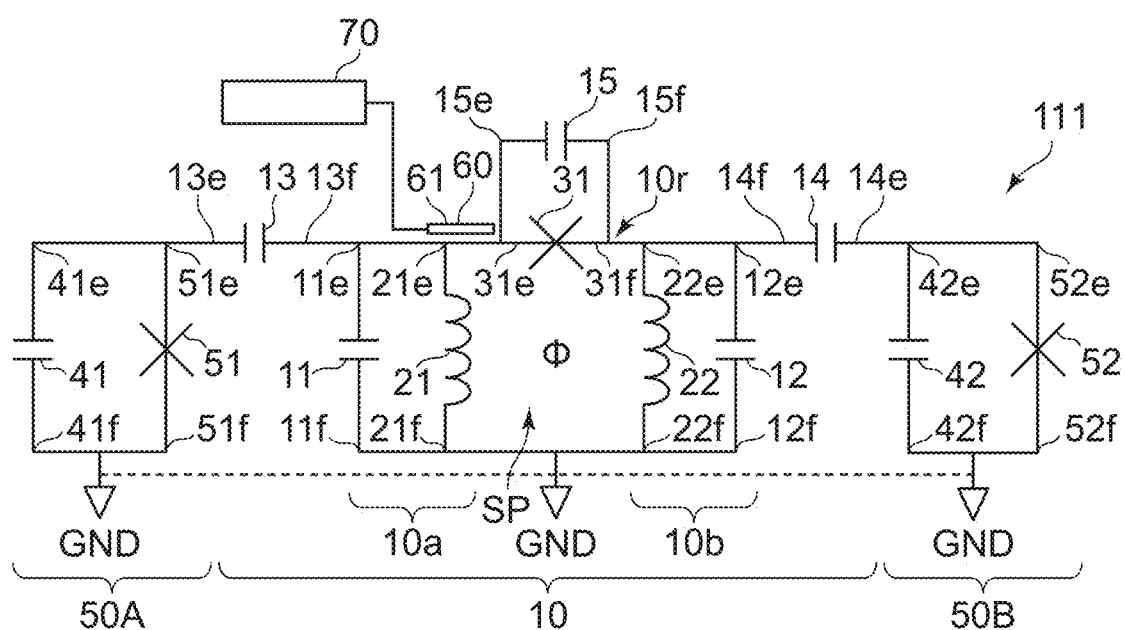
FIG. 11 is a schematic view illustrating a coupler and a calculating device according to the first embodiment.

FIG. 11 is a schematic view illustrating a coupler and a calculating device according to the first embodiment.

In the calculating device 111 according to the embodiment as shown in FIG. 11, the coupler 10 includes a fifth capacitor 15. Otherwise, the configuration of the calculating device 111 may be similar to the configuration of the calculating device 110.

The fifth capacitor 15 includes a fifth capacitor end portion 15e and a fifth capacitor other-end portion 15f. The fifth capacitor end portion 15e is electrically connected with the first capacitor end portion 11e. The fifth capacitor end portion 15e also is electrically connected with the first Josephson junction end portion 31e, the first inductor end portion 21e, and the third capacitor other-end portion 13f. The fifth capacitor other-end portion 15f is electrically connected with the second capacitor end portion 12e. The fifth capacitor other-end portion 15f also is electrically connected with the first Josephson junction other-end portion 31f, the second inductor end portion 22e, and the fourth capacitor other-end portion 14f. For example, the fifth capacitor 15 makes it easier to adjust the coupling characteristics. For example, the position of the ZZ-coupling zero point can be adjusted. For example, by using the fifth capacitor 15, a coupler and a calculating device that are robust with respect to magnetic flux fluctuation can be provided.

For example, the capacitance of the fifth capacitor 15 is less than the capacitance of the first capacitor 11 and less than the capacitance of the second capacitor 12. The fifth capacitor 15 may be provided as necessary and may be omitted.

The first nonlinear resonator Josephson junction 51 and the second nonlinear resonator Josephson junction 52 may include parasitic capacitances. The parasitic capacitances are small (e.g., about 1 fF) compared to the capacitances of the first to fifth capacitors 11 to 15, and are negligible.

Figure 12A:
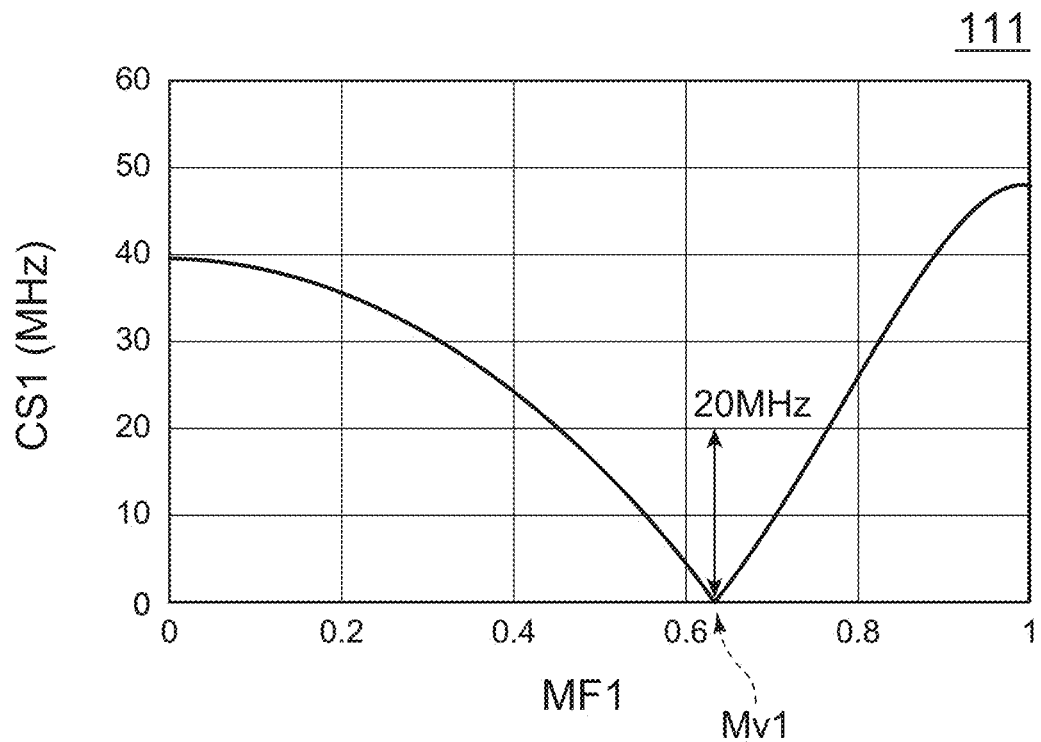
FIGS. 12A and 12B are graphs illustrating coupling strength and characteristic of a coupler and a calculating device according to the first embodiment.
Figure 12B:
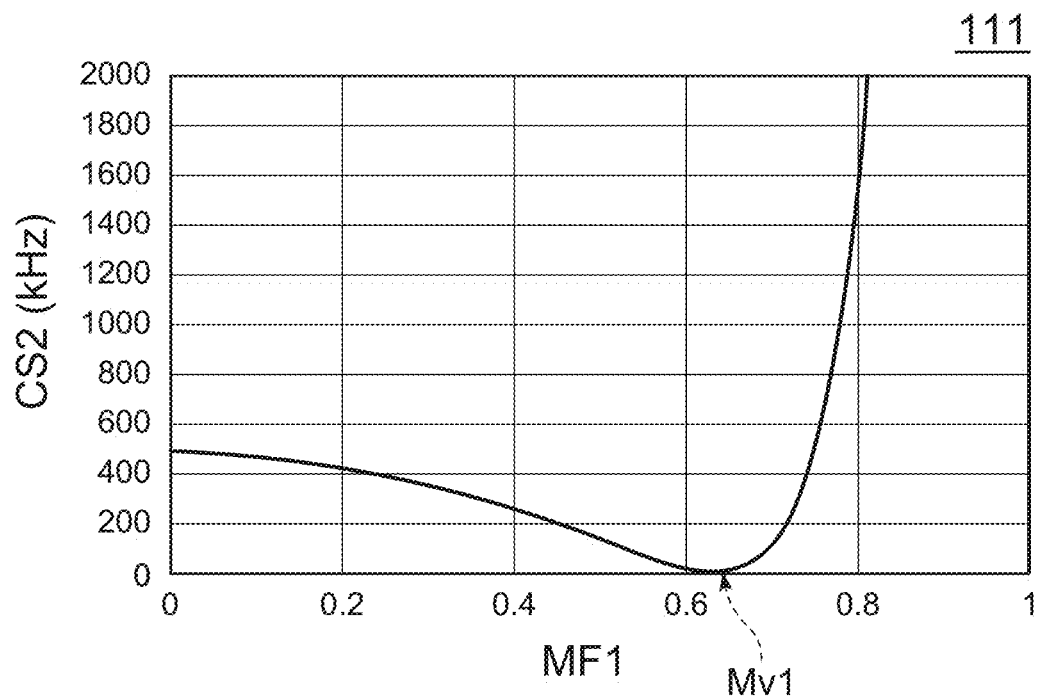

FIGS. 12A and 12B are graphs illustrating coupling strength and characteristic of the coupler and the calculating device according to the first embodiment.

These figures correspond to the calculating device 111 according to the embodiment. In the example of the calculating device 111, the capacitance of the fifth capacitor 15 is 1.6 fF. In FIGS. 12A and 12B, the horizontal axis is the magnetic flux MF1 of the space SP (the loop 10r). The vertical axis of FIG. 12A is the coupling strength CS1. The vertical axis of FIG. 12B is the coupling strength CS2 that is related to the residual coupling.

In the calculating device 111 as shown in FIG. 12A, a high coupling strength CS1 is obtained. A magnetic flux MF1 exists at which the coupling strength CS1 is substantially zero. The first magnetic flux value Mv1 is, for example, 0.62. As shown in FIG. 12B, the coupling strength CS1 can be substantially zero. For example, the ZZ-coupling can be robustly set to zero by including the fifth capacitor 15. It is easier to maintain the ZZ-coupling at substantially zero.

Figure 13A:
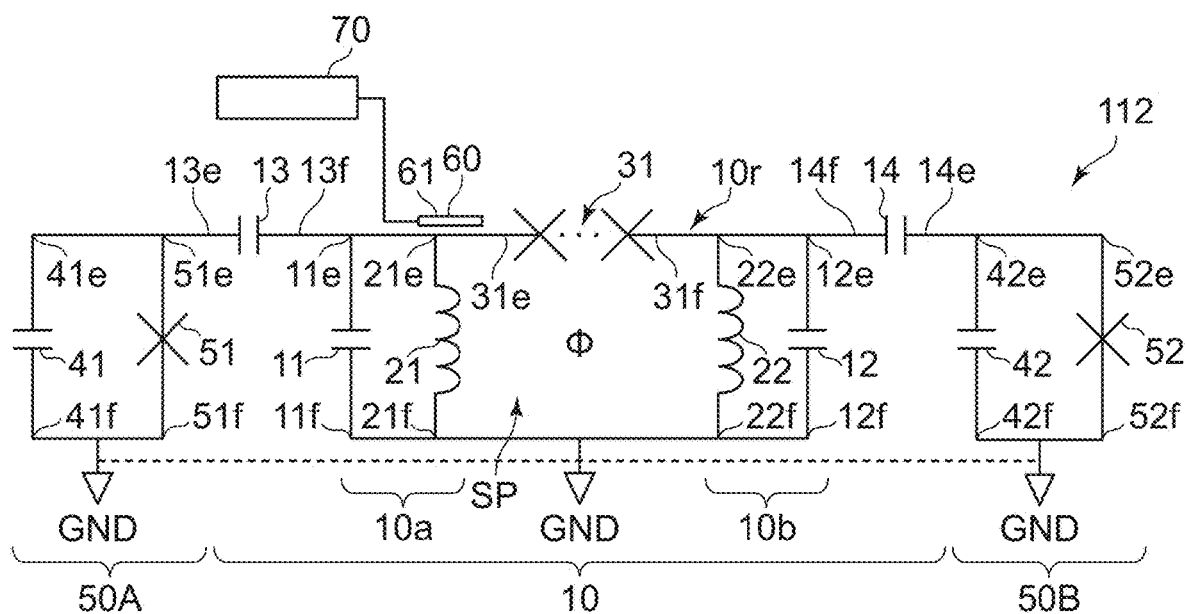
FIGS. 13A and 13B are schematic views illustrating couplers and calculating devices according to the first embodiment.
Figure 13B:
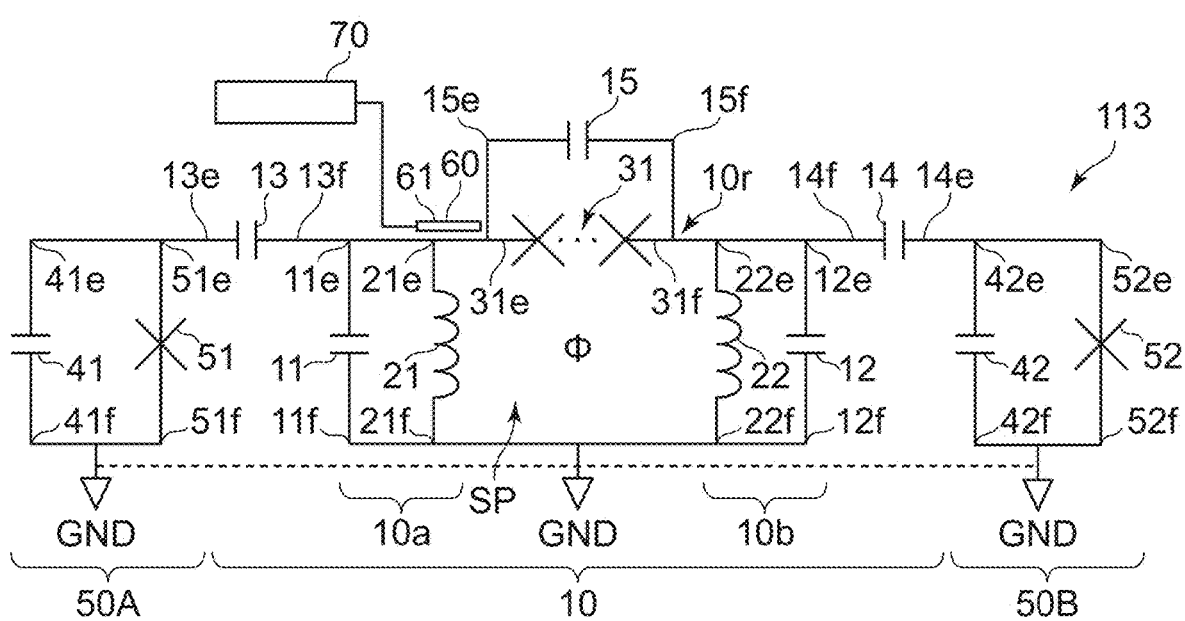

FIGS. 13A and 13B are schematic views illustrating couplers and calculating devices according to the first embodiment.

Multiple first Josephson junctions 31 are included in couplers 112 and 113 as shown in FIGS. 13A and 13B. The multiple first Josephson junctions 31 are connected in series. One end of the multiple first Josephson junctions 31 corresponds to the first Josephson junction end portion 31e. The other end of the multiple first Josephson junctions 31 corresponds to the first Josephson junction other-end portion 31f.

Second Embodiment

FIGS. 14A to 14H are schematic views illustrating a portion of a coupler according to a second embodiment.

Figure 14A:
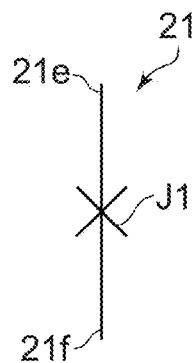
FIGS. 14A to 14H are schematic views illustrating portions of a coupler according to a second embodiment.
Figure 14B:
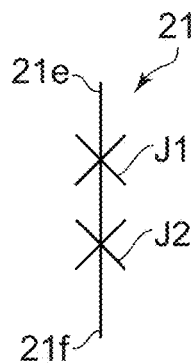
Figure 14C:
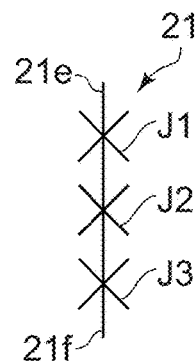
Figure 14D:
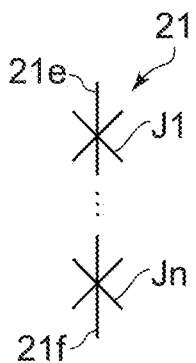

As shown in FIG. 14A, the first inductor 21 may include a first inductor Josephson junction (a Josephson junction J1, etc.). As shown in FIGS. 14B and 14C, the first inductor 21 may include multiple first inductor Josephson junctions (the Josephson junctions J1 to J3, etc.). As shown in FIG. 14D, the multiple first inductor Josephson junctions may include Josephson junctions J1 to Jn (n being an integer that is not less than 2). The multiple first inductor Josephson junctions are electrically connected in series to each other.

Figure 14E:
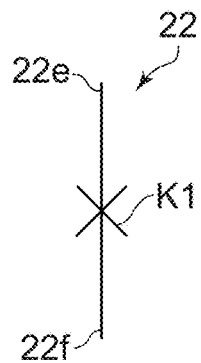
Figure 14F:
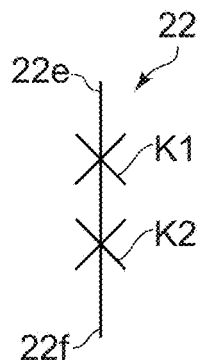
Figure 14G:
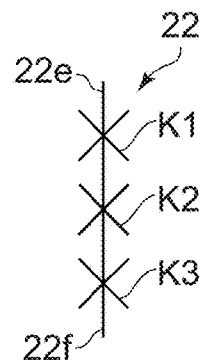
Figure 14H:
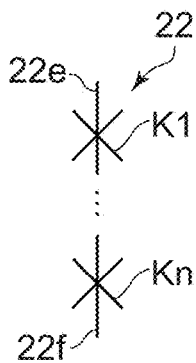

As shown in FIG. 14E, the second inductor 22 may include a second inductor Josephson junction (a Josephson junction K1, etc.). As shown in FIGS. 14F and 14G, the second inductor 22 may include multiple second inductor Josephson junctions (the Josephson junctions K1 to K3, etc.). As shown in FIG. 14H, the multiple second inductor Josephson junctions may include Josephson junctions K1 to Kn (n being an integer that is not less than 2). The multiple second inductor Josephson junctions are electrically connected in series to each other.

Figure 15A:
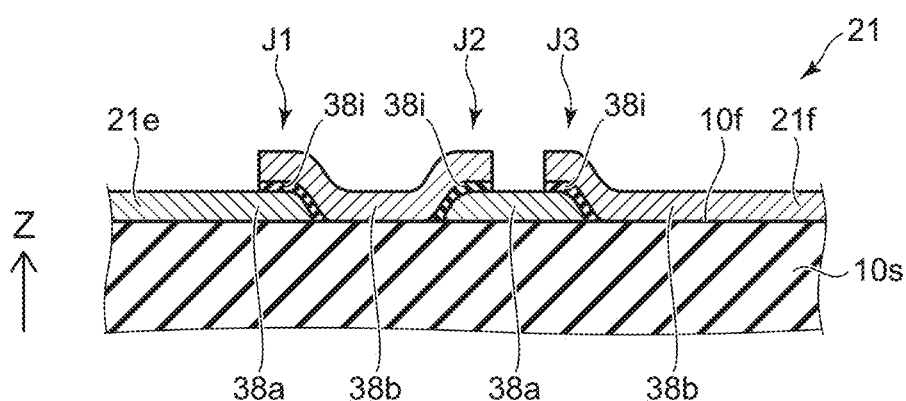
FIGS. 15A and 15B are schematic cross-sectional views illustrating portions of the coupler according to the second embodiment.
Figure 15B:
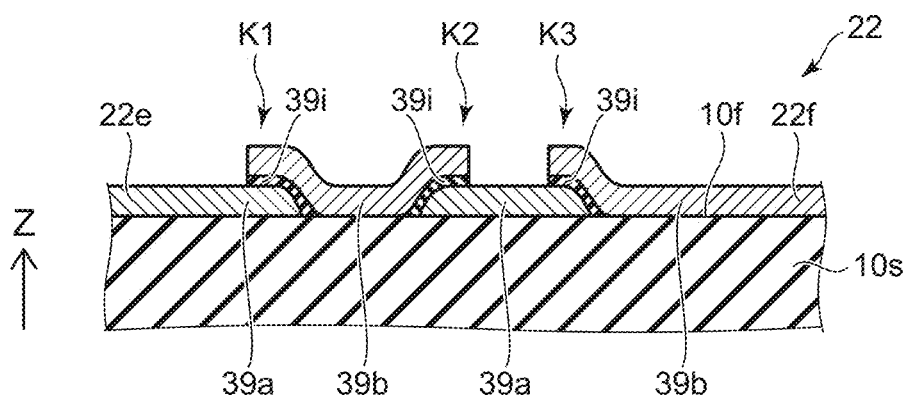

FIGS. 15A and 15B are schematic cross-sectional views illustrating portions of the coupler according to the second embodiment.

As shown in FIG. 15A, the first inductor 21 includes multiple first inductor Josephson junctions (the Josephson junctions J1 to J3, etc.). The multiple first inductor Josephson junctions are located on the first surface 10f of the base body 10s. The multiple first inductor Josephson junctions (the Josephson junctions J1 to J3, etc.) include a conductive film 38a, a conductive film 38b, and an insulating film 38i. The insulating film 38i is located between the conductive film 38a and the conductive film 38b.

As shown in FIG. 15B, the second inductor 22 includes multiple second inductor Josephson junctions (the Josephson junctions K1 to K3, etc.). The multiple second inductor Josephson junctions are located on the first surface 10f of the base body 10s. The multiple second inductor Josephson junctions (the Josephson junctions K1 to K3, etc.) include a conductive film 39a, a conductive film 39b, and an insulating film 39i. The insulating film 39i is located between the conductive film 39a and the conductive film 39b.

The conductive film 38a, the conductive film 38b, the conductive film 39a, and the conductive film 39b may include the material included in the conductive film 35a. The insulating film 38i and the insulating film 39i may include the material included in the insulating film 35i.

FIGS. 16A to 16F are schematic views illustrating portions of the coupler according to the second embodiment.

FIGS. 16A and 16B are plan views. FIG. 16C is a line A1-A2 cross-sectional view of FIG. 16A. FIG. 16E is a line A3-A4 cross-sectional view of FIG. 16A. FIG. 16D is a line B1-B2 cross-sectional view of FIG. 16B. FIG. 16F is a line B3-B4 cross-sectional view of FIG. 16B.

As shown in FIG. 16C, the first capacitor 11 may include two conductors extending along the Z-axis direction through the base body 10s. As shown in FIG. 16D, the second capacitor 12 may include two conductors extending along the Z-axis direction through the base body 10s. These capacitors include, for example, vertical structures (or through-substrate-type structures). These capacitors may include, for example, TSV (through-silicon vias). The planar sizes of the capacitors can be small.

As shown in FIG. 16E, the first inductor 21 includes the Josephson junction J1. In the example, the stacking direction of the conductive film 38a, the insulating film 38i, and the conductive film 38b in the Josephson junction J1 crosses the first surface 10f. The coupling portion can be small.

As shown in FIG. 16F, the second inductor 22 includes the Josephson junction K1. In the example, the stacking direction of the conductive film 39a, the insulating film 39i, and the conductive film 39b in the Josephson junction K1 crosses the first surface 10f. The coupling portion can be small.

Figure 17A:
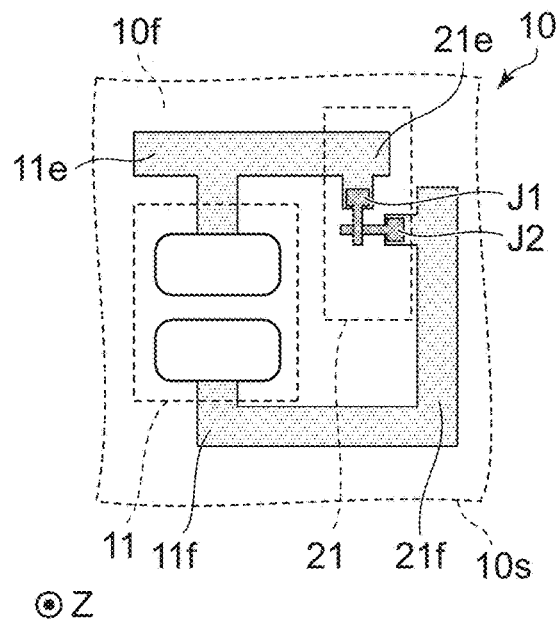
FIGS. 17A and 17B are schematic plan views illustrating portions of a coupler of another example according to the second embodiment.
Figure 17B:
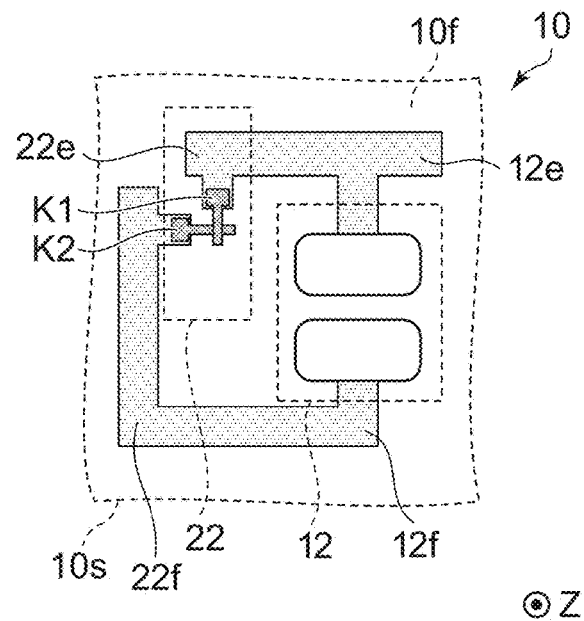

FIGS. 17A and 17B are schematic plan views illustrating portions of a coupler according to the second embodiment.

As shown in FIG. 17A, the first inductor 21 includes the Josephson junctions J1 and J2. As shown in FIG. 17B, the second inductor 22 includes the Josephson junctions K1 and K2. In these Josephson junctions as well, the stacking direction crosses the first surface 10f.

Figure 18A:
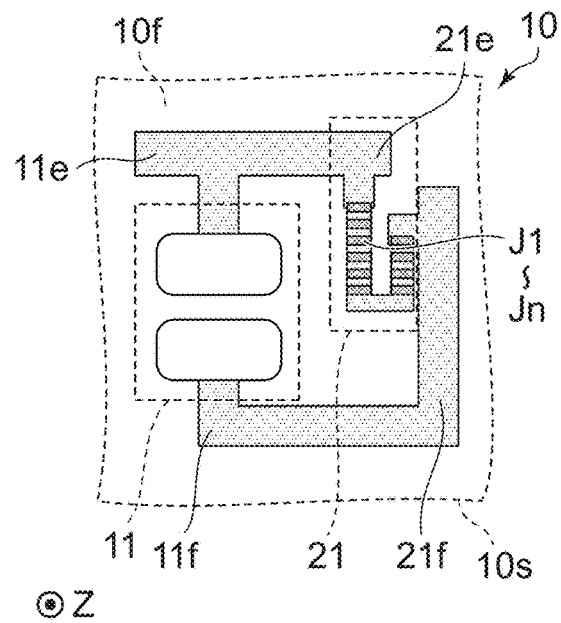
FIGS. 18A and 18B are schematic plan views illustrating portions of a coupler of another example according to the second embodiment.
Figure 18B:
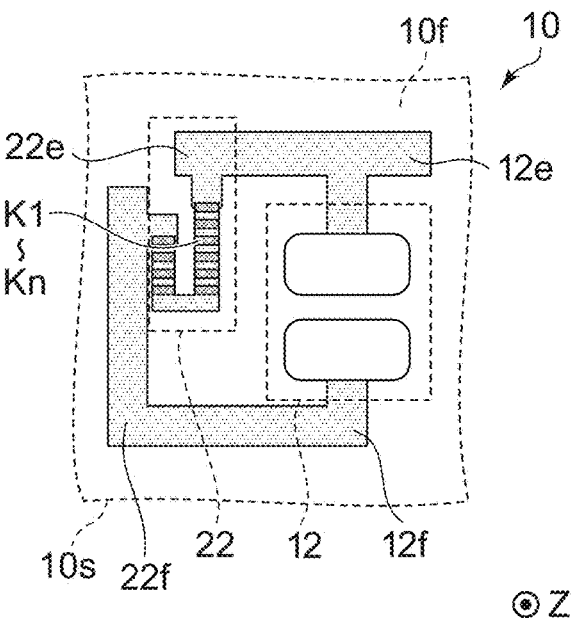

FIGS. 18A and 18B are schematic plan views illustrating portions of a coupler according to the second embodiment.

As shown in FIG. 18A, the first inductor 21 includes multiple Josephson junctions (the Josephson junction J1 to the Josephson junction Jn). As shown in FIG. 18B, the second inductor 22 includes multiple Josephson junctions (the Josephson junctions K1 to Kn). In these Josephson junctions as well, the stacking direction crosses the first surface 10f.

Figure 19:
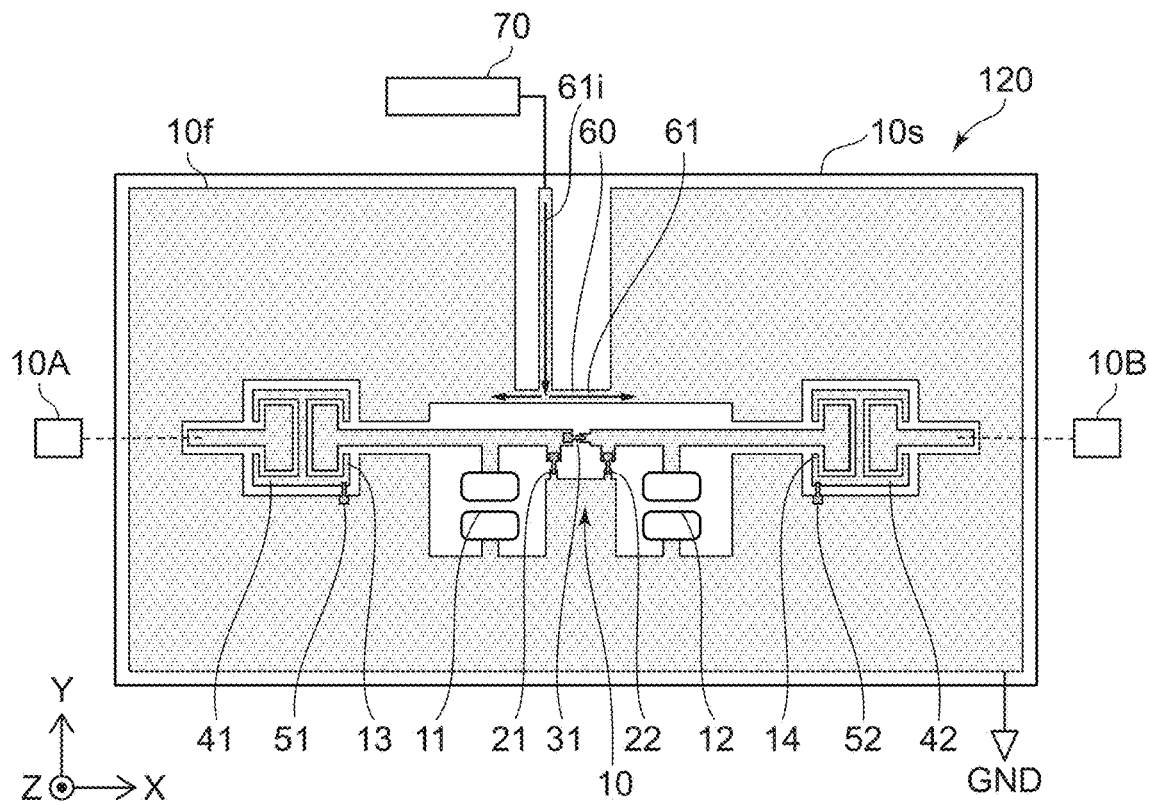
FIG. 19 is a schematic plan view illustrating a coupler and a calculating device of another example according to the second embodiment.

FIG. 19 is a schematic plan view illustrating a coupler and a calculating device according to the second embodiment.

In the calculating device 120 according to the embodiment as shown in FIG. 19, the first conductive member 61 is included as the first magnetic field application part 60. At least a portion of the first conductive member 61 is along the X-Y plane. A magnetic flux control current 61i is supplied from the controller 70 to the first conductive member 61. The first resonator capacitor 41 (and the first nonlinear resonator Josephson junction 51) can be coupled with another coupler 10A. The second resonator capacitor 42 (and the second nonlinear resonator Josephson junction 52) can be coupled with another coupler 10B.

Figure 20:
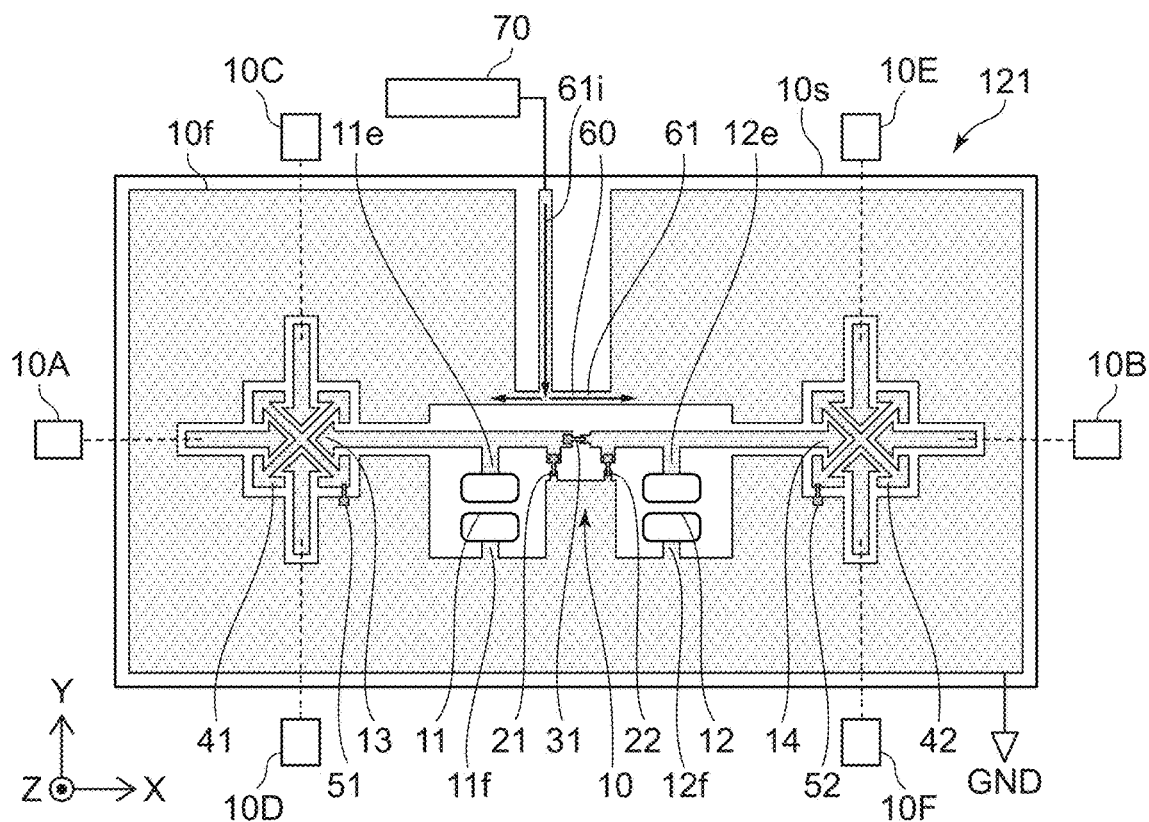
FIG. 20 is a schematic plan view illustrating a coupler and a calculating device of another example according to the second embodiment.

FIG. 20 is a schematic plan view illustrating a coupler and a calculating device according to the second embodiment.

In the calculating device 121 according to the embodiment as shown in FIG. 20, a portion that is included in the third capacitor 13 and a portion that is included in the first resonator capacitor 41 are oblique to the direction (in the example, the Y-axis direction) from the first capacitor other-end portion 11f toward the first capacitor end portion 11e. A portion that is included in the fourth capacitor 14 and a portion that is included in the second resonator capacitor 42 are oblique to the direction (in the example, the Y-axis direction) from the second capacitor other-end portion 12f toward the second capacitor end portion 12e. The first resonator capacitor 41 (and the first nonlinear resonator Josephson junction 51) can be coupled with the other couplers 10A, 10C, and 10D. The second resonator capacitor 42 (and the second nonlinear resonator Josephson junction 52) can be coupled with the other couplers 10B, 10E, and 10F.

Figure 21:
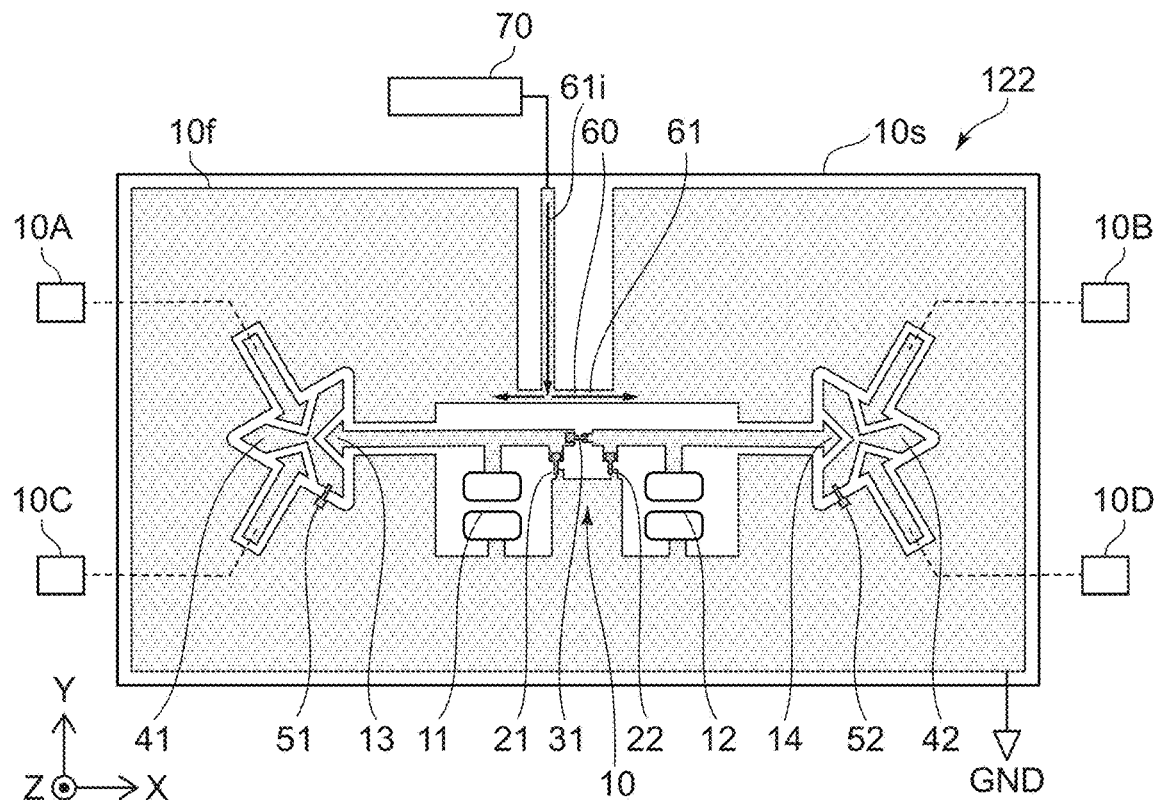
FIG. 21 is a schematic plan view illustrating a coupler and a calculating device of another example according to the second embodiment.

FIG. 21 is a schematic plan view illustrating a coupler and a calculating device according to the second embodiment.

In the calculating device 122 according to the embodiment as shown in FIG. 21, the first resonator capacitor 41 (and the first nonlinear resonator Josephson junction 51) can be coupled with the other couplers 10A and 10C. The second resonator capacitor 42 (and the second nonlinear resonator Josephson junction 52) can be coupled with the other couplers 10B and 10D.

Figure 22:
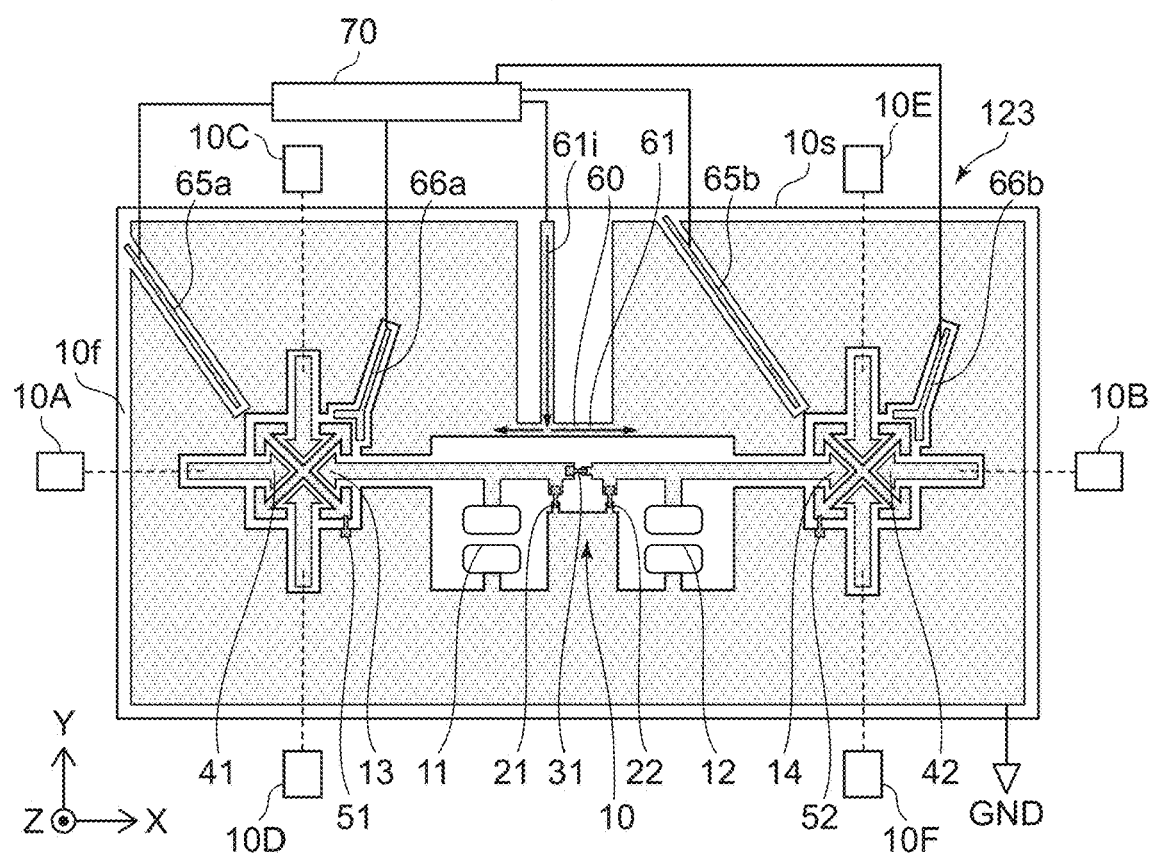
FIG. 22 is a schematic plan view illustrating a coupler and a calculating device of another example according to the second embodiment.

FIG. 22 is a schematic plan view illustrating a coupler and a calculating device according to the second embodiment.

As shown in FIG. 22, the calculating device 123 according to the embodiment may include a first excitation conductive portion 65a and a second excitation conductive portion 65b. The controller 70 can excite the first nonlinear resonator 50A via the first excitation conductive portion 65a. The controller 70 can excite the second nonlinear resonator 50B via the second excitation conductive portion 65b. For example, a signal that includes an AC component is supplied to the first and second excitation conductive portions 65a and 65b.

As shown in FIG. 22, the calculating device 123 may include a first read resonator 66a and a second read resonator 66b. The controller 70 is configured to detect the state of the first nonlinear resonator 50A via the first read resonator 66a. The controller 70 is configured to detect the state of the second nonlinear resonator 50B via the second read resonator 66b. For example, the resonant frequency fb1 of the first nonlinear resonator 50A can be identified using a reflection spectrum measurement via the first excitation conductive portion 65a or the first read resonator 66a. For example, the resonant frequency fb2 of the second nonlinear resonator 50B can be identified using a reflection spectrum measurement via the second excitation conductive portion 65b or the second read resonator 66b.

Figure 23A:
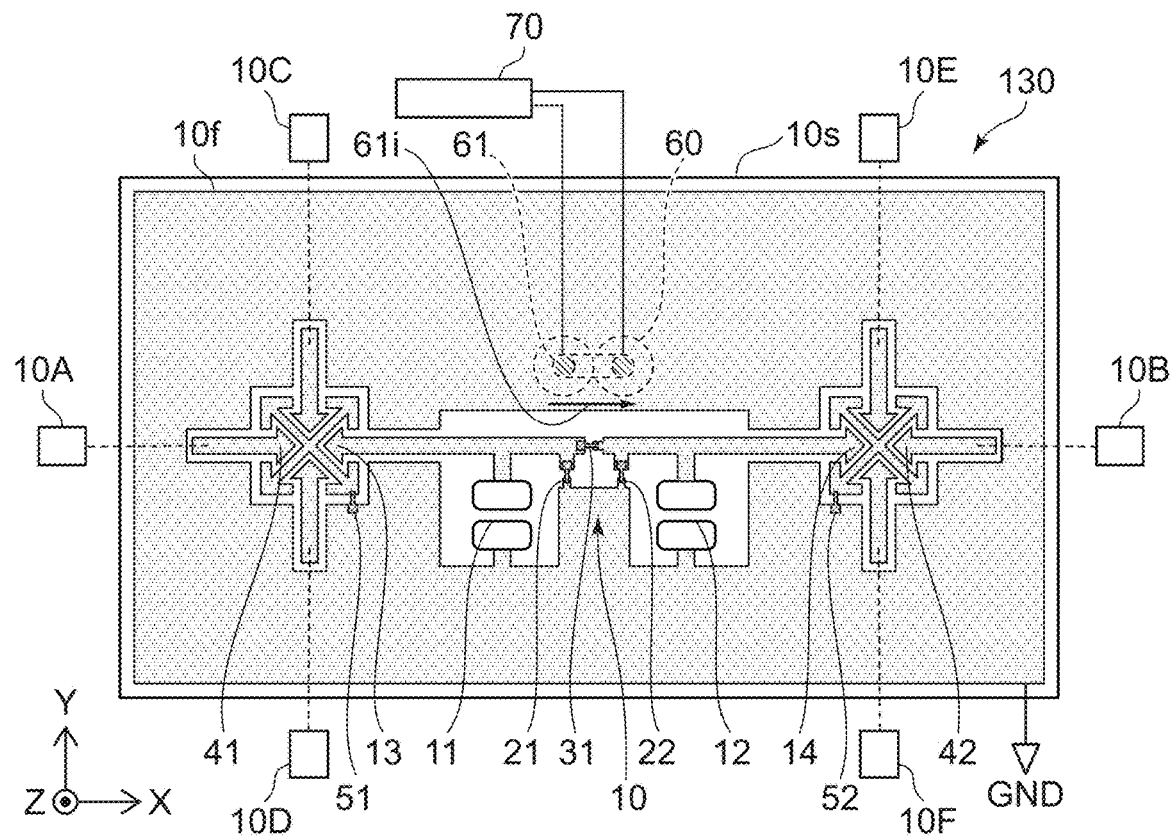
FIG. 23A is a schematic plan view illustrating a coupler and a calculating device according to the second embodiment.
Figure 23B:
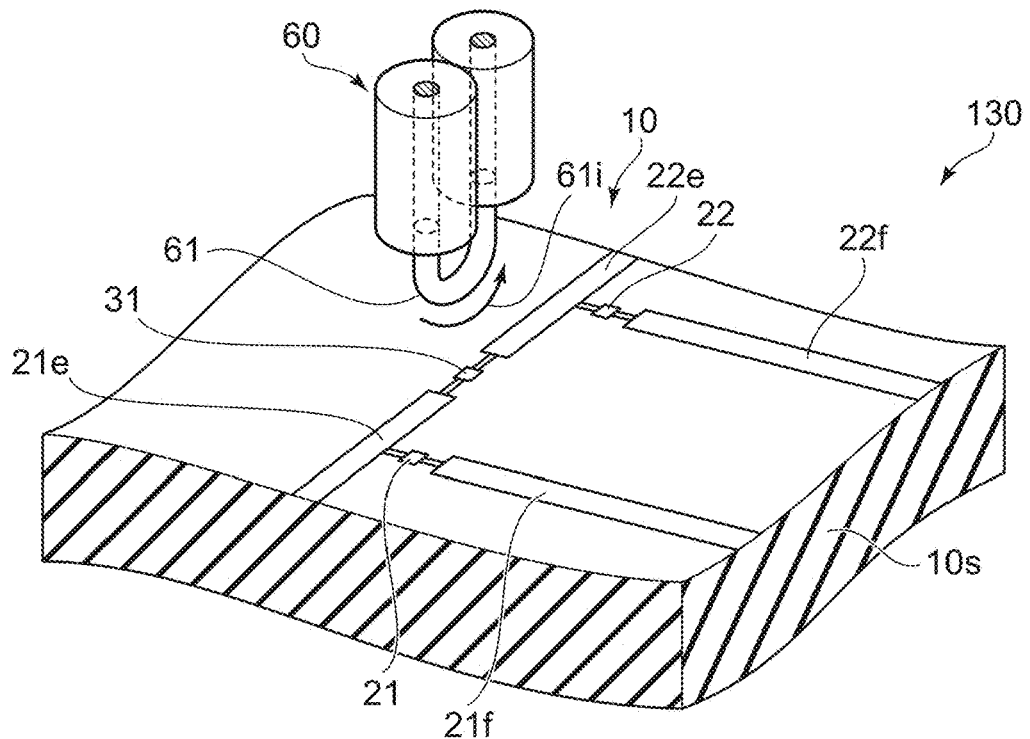
FIG. 23B is a schematic perspective view illustrating a portion of the coupler and the calculating device according to the second embodiment.

FIGS. 23A and 23B are schematic views illustrating a coupler and a calculating device according to the second embodiment.

FIG. 23A is a plan view. FIG. 23B is an enlarged perspective view of a portion of the coupler and the calculating device.

In the calculating device 130 as shown in FIGS. 23A and 23B, the first conductive member 61 is included as the first magnetic field application part 60. For example, the direction from the coupler 10 toward at least a portion of the first conductive member 61 is along the Z-axis direction (a direction crossing the first surface 10f). The first conductive member 61 is, for example, a coaxial line. The magnetic flux control current 61i includes a component in a direction that crosses the Z-axis direction (a direction along the X-Y plane) where the first conductive member 61 approaches the coupler 10.

Figure 24:
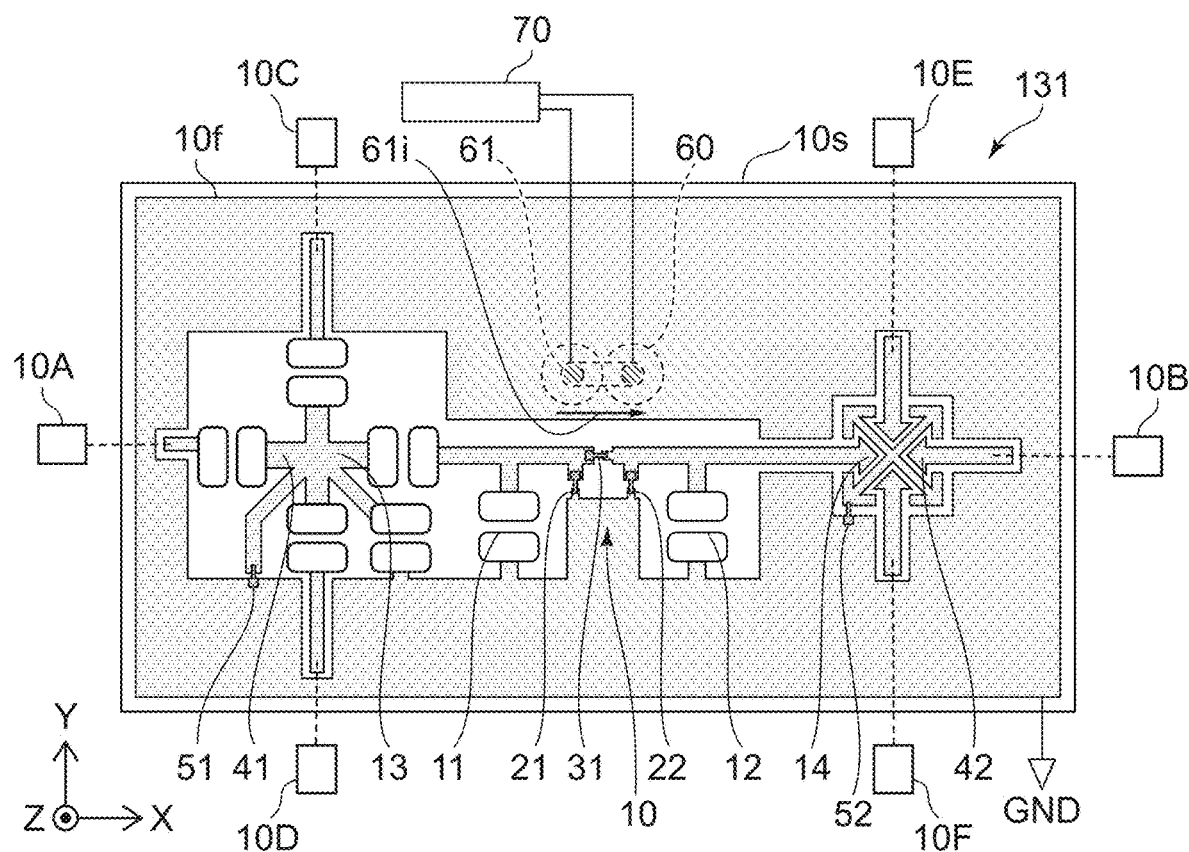
FIG. 24 is a schematic plan view illustrating a coupler and a calculating device according to the second embodiment.

FIG. 24 is a schematic plan view illustrating a coupler and a calculating device according to the second embodiment.

In the calculating device 131 as shown in FIG. 24, the first resonator capacitor 41 has a vertical structure (referring to FIGS. 16C and 16D). The vertical structure includes two conductors extending along the Z-axis direction through the base body 10s.

Figure 25A:
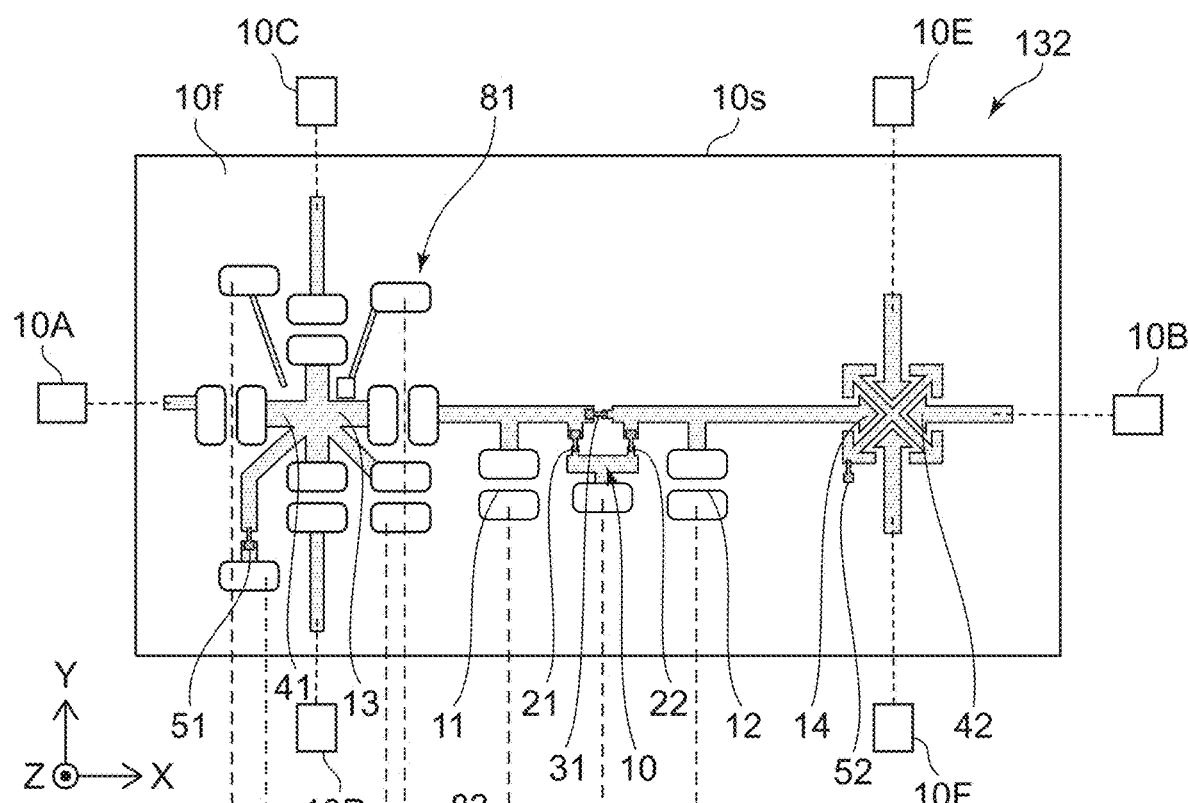
FIGS. 25A and 25B are schematic plan views illustrating a coupler and a calculating device according to the second embodiment.
Figure 25B:
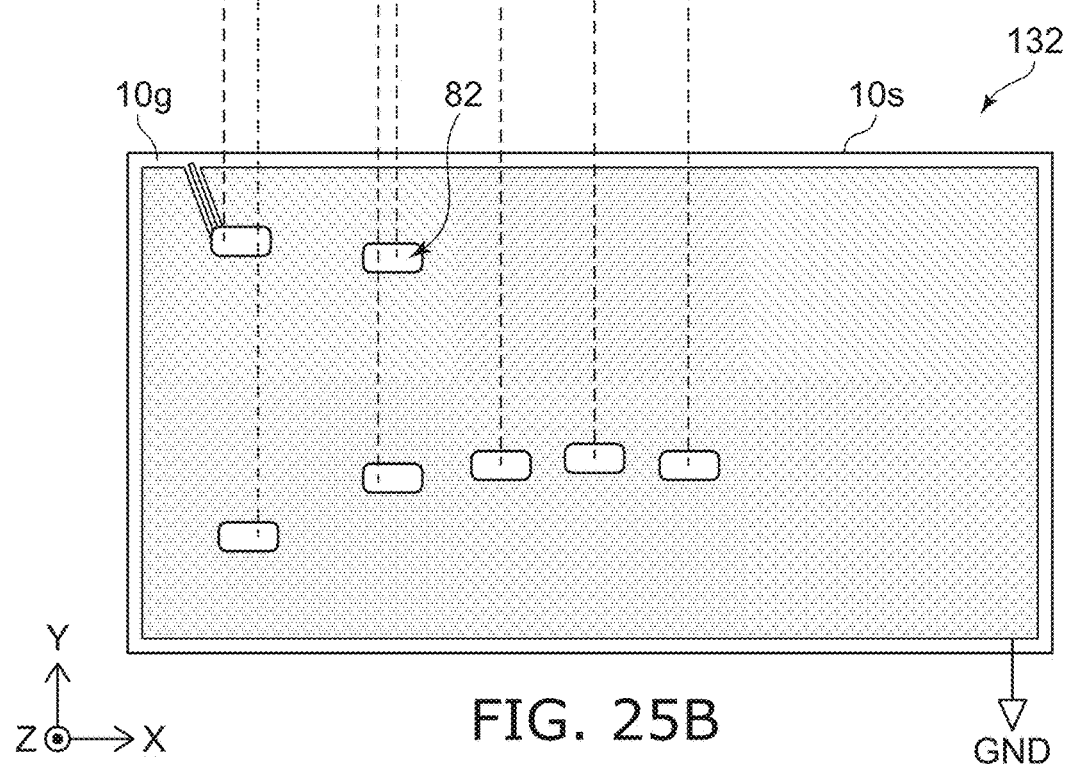

FIGS. 25A and 25B are schematic plan views illustrating a coupler and a calculating device according to the second embodiment.

FIG. 25A illustrates a conductive pattern 81 provided at the first surface 10f of the base body 10s. FIG. 25B illustrates a conductive pattern 82 provided at a second surface 10g of the base body 10s. The second surface 10g is the surface at the side opposite to the first surface 10f. In the calculating device 132 as shown in FIGS. 25A and 25B, a portion of the conductive pattern 81 is electrically connected with the conductive pattern 82 by a conductive member 83 that is along the Z-axis direction through the base body 10s. For example, an electrical connection may be performed to the outside via the conductive pattern 82. The conductive member 83 is, for example, a through-substrate-type connection member. According to the embodiment, a portion of a conductive member (the ground GND of a fixed potential or a circuit element) may be located at one of the first surface 10f or the second surface 10g of the base body 10s; another portion of the conductive member may be located at the other of the first surface 10f or the second surface 10g; and the portion and the other portion may be connected by a through-substrate-type connection member. According to the embodiment, connections may be performed by capacitive coupling in a flip-chip structure, etc.

Other than the description of the second embodiment described above, the configurations described in reference to the first embodiment are applicable to the second embodiment within the extent of technical feasibility.

Characteristics of the coupler 10 and the calculating device 110 according to embodiments will now be described.

The Lagrangian of a system that includes the coupler 10, the first nonlinear resonator 50A coupled with the coupler 10, and the second nonlinear resonator 50B coupled with the coupler 10 is represented by the following first formula.

$$\mathcal{L} = \mathcal{L}_1 + \mathcal{L}_2 + \mathcal{L}_c + \mathcal{L}_I \quad (1)$$

The left side of the first formula is the Lagrangian of the system that includes the coupler 10, the first nonlinear resonator 50A coupled with the coupler 10, and the second nonlinear resonator 50B coupled with the coupler 10.

The first term of the right side of the first formula is the Lagrangian of the first nonlinear resonator 50A. The second term of the right side of the first formula is the Lagrangian of the second nonlinear resonator 50B. The third term of the right side of the first formula is the Lagrangian of the coupler 10. The fourth term of the right side of the first formula is the Lagrangian of the interaction between the coupler 10, the first nonlinear resonator 50A, and the second nonlinear resonator 50B.

The Lagrangian of the first nonlinear resonator 50A is represented by the following second formula. In the second formula, "$C_1$" is the capacitance of the first resonator capacitor 41.

$$\mathcal{L}_1 = \frac{C_1}{2}\dot{\phi}_1^2 + \phi_0 I_{c1} \cos\theta_1 \quad (2)$$

The Lagrangian of the second nonlinear resonator 50B is represented by the following third formula. In the third formula, "$C_2$" is the capacitance of the second resonator capacitor 42.

$$\mathcal{L}_2 = \frac{C_2}{2}\dot{\phi}_2^2 + \phi_0 I_{c2} \cos\theta_2 \quad (3)$$

The Lagrangian of the interaction between the coupler 10, the first nonlinear resonator 50A, and the second nonlinear resonator 50B is represented by the following fourth formula. In the fourth formula, "$C_c$" is the capacitance of each of the third and fourth capacitors 13 and 14.

$$\begin{aligned}\mathcal{L}_I &= \frac{C_c}{2}(\dot{\phi}_1 - \dot{\phi}_{c1})^2 + \frac{C_c}{2}(\dot{\phi}_2 - \dot{\phi}_{c2})^2 \\ &= \frac{C_c}{2}\left(\dot{\phi}_1 - \frac{\dot{\phi}_{c+} + \dot{\phi}_{c1}}{2}\right)^2 + \frac{C_c}{2}\left(\dot{\phi}_2 - \frac{\dot{\phi}_{c+} - \dot{\phi}_{c1}}{2}\right)^2\end{aligned} \quad (4)$$

The Lagrangian of the coupler 10 is represented by the following fifth formula. In the fifth formula, "C" is the capacitance of each of the first and second capacitors 11 and 12.

$$\begin{aligned}\mathcal{L}_c &= \frac{C}{2}\dot{\phi}_{c1}^2 - \frac{\phi_{c1}^2}{2L} + \frac{C}{2}\dot{\phi}_{c2}^2 - \frac{\phi_{c2}^2}{2L} + \frac{C_J}{2}(\dot{\phi}_{c1} - \dot{\phi}_{c2} + \dot{\Phi})^2 + \phi_0 I_c \cos\left(\theta_{c1} - \theta_{c2} + \frac{\Phi}{\phi_0}\right) \\ &= \frac{C}{4}\dot{\phi}_{c+}^2 - \frac{\phi_{c+}^2}{4L} + \frac{C}{4}\dot{\phi}_{c-}^2 - \frac{\phi_{c-}^2}{4L} + \frac{C_J}{2}(\dot{\phi}_{c-} + \dot{\Phi})^2 + \phi_0 I_c \cos\left(\theta_{c-} + \frac{\Phi}{\phi_0}\right)\end{aligned} \quad (5)$$

Here, $\phi$ is the magnetic flux operator. $\phi$ has the relationship with a phase difference $\theta$ represented by the following sixth formula.

$$\phi = \phi_0 \theta \quad (6)$$

A magnetic flux operator $\phi_{c+}$ for the "+mode" of the coupler 10 is represented by the following seventh formula.

$$\phi_{c+} \equiv \phi_{c1} + \phi_{c2} \quad (7)$$

A magnetic flux operator $\phi_{c-}$ for the "−mode" of the coupler 10 is represented by the following eighth formula.

$$\phi_{c-} \equiv \phi_{c1} - \phi_{c2} \quad (8)$$

In the seventh and eighth formulas, $\phi_{c1}$ is the magnetic flux operator for the first part 10a. In the eighth and ninth formulas, $\phi_{c2}$ is the magnetic flux operator for the second part 10b.

The signs of the first and second terms are interchanged on the right side of the fourth formula recited above. The coupling between the qubits via the ±modes cancels.

The first term and the second term on the right side of the fifth formula recited above correspond to the "+mode". The third term to the sixth term on the right side of the fifth formula correspond to the "−mode". The "+mode" corresponds to an LC resonator. The "−mode" corresponds to a fluxonium qubit. The frequency is changeable due to the existence of the fluxonium qubit.

Thus, according to the embodiment, the coupler 10 simultaneously includes the two modes of the "+mode" and the "−mode". A changeable frequency is obtained by utilizing the "−mode".

To simplify the above description, the case is described where the first capacitor 11 and the second capacitor 12 are the same (C). For simplification, the case is described where the capacitances of the third and fourth capacitors 13 and 14 are the same ($C_c$). According to the embodiment, the capacitance of the first capacitor 11 may be different from the capacitance of the second capacitor 12. According to the embodiment, the capacitance of the third capacitor 13 may be different from the capacitance of the fourth capacitor 14.

Embodiments may include the following configurations (e.g., technological proposals).

Configuration 1

A coupler, comprising:

a first capacitor including a first capacitor end portion and a first capacitor other-end portion;

a first inductor including
a first inductor end portion electrically connected with the first capacitor end portion, and
a first inductor other-end portion;

a second capacitor including a second capacitor end portion and a second capacitor other-end portion;

a second inductor including
a second inductor end portion electrically connected with the second capacitor end portion, and
a second inductor other-end portion electrically connected with the first capacitor other-end portion, the first inductor other-end portion, and the second capacitor other-end portion;

a first Josephson junction including
a first Josephson junction end portion electrically connected with the first capacitor end portion, and
a first Josephson junction other-end portion electrically connected with the second capacitor end portion,
a space being surrounded with the first inductor, the second inductor, and the first Josephson junction;

a third capacitor including
a third capacitor end portion electrically connectable with a first nonlinear resonator, and
a third capacitor other-end portion electrically connected with the first capacitor end portion; and
a fourth capacitor including
a fourth capacitor end portion electrically connectable with a second nonlinear resonator, and
a fourth capacitor other-end portion electrically connected with the second capacitor end portion.

Configuration 2
The coupler according to Configuration 1, wherein
the first inductor includes a first conductive layer having a meandering structure, and
the second inductor includes a second conductive layer having a meandering structure.

Configuration 3
The coupler according to Configuration 1, wherein
the first inductor includes a first inductor Josephson junction, and
the second inductor includes a second inductor Josephson junction.

Configuration 4
The coupler according to Configuration 1, wherein
the first inductor includes a plurality of first inductor Josephson junctions,
the plurality of first inductor Josephson junctions is electrically connected in series to each other,
the second inductor includes a plurality of second inductor Josephson junctions, and
the plurality of second inductor Josephson junctions is electrically connected in series to each other.

Configuration 5
The coupler according to any one of Configurations 1 to 4, further comprising:
a fifth capacitor including a fifth capacitor end portion and a fifth capacitor other-end portion,
the fifth capacitor end portion being electrically connected with the first capacitor end portion,
the fifth capacitor other-end portion being electrically connected with the second capacitor end portion.

Configuration 6
The coupler according to Configuration 5, wherein
a capacitance of the fifth capacitor is less than a capacitance of the first capacitor and less than a capacitance of the second capacitor.

Configuration 7
The coupler according to any one of Configurations 1 to 5, wherein
capacitances of the first and second capacitors are greater than 0.1 times capacitances of the third and fourth capacitors.

Configuration 8
The coupler according to any one of Configurations 1 to 7, further comprising:
a first conductive member configured to apply a magnetic field to the space,
a coupling strength between the first nonlinear resonator and the second nonlinear resonator changes according to magnetic flux in the space.

Configuration 9
The coupler according to any one of Configurations 1 to 8, wherein
the coupler can resonate in a plurality of modes,
resonant frequencies of the plurality of modes are higher than a resonant frequency of the first nonlinear resonator, higher than a resonant frequency of the second nonlinear resonator, and lower than a sum of the resonant frequency of the first nonlinear resonator and the resonant frequency of the second nonlinear resonator.

Configuration 10
A calculating device, comprising:
the coupler according to any one of Configurations 1 to 7;
the first nonlinear resonator; and
the second nonlinear resonator.

Configuration 11
The calculating device according to Configuration 10, wherein
the first nonlinear resonator includes:
a first nonlinear resonator Josephson junction; and
a first resonator capacitor,
an end portion of the first nonlinear resonator Josephson junction and an end portion of the first resonator capacitor are electrically connected with the third capacitor end portion,
an other end portion of the first nonlinear resonator Josephson junction and an other end portion of the first resonator capacitor are electrically connected with the first capacitor other-end portion,
the second nonlinear resonator includes:
a second nonlinear resonator Josephson junction; and
a second resonator capacitor,
an end portion of the second nonlinear resonator Josephson junction and an end portion of the second resonator capacitor are electrically connected with the fourth capacitor end portion, and
an other end portion of the second nonlinear resonator Josephson junction and an other end portion of the second resonator capacitor are electrically connected with the second capacitor other-end portion.

Configuration 12
The calculating device according to Configuration 11, wherein
a capacitance of the first capacitor is greater than 0.1 times a capacitance of the first resonator capacitor, and
a capacitance of the second capacitor is greater than 0.1 times a capacitance of the second resonator capacitor.

Configuration 13
The calculating device according to Configuration 12, wherein
a capacitance of the third capacitor is greater than 0.1 times the capacitance of the first resonator capacitor, and
a capacitance of the fourth capacitor is greater than 0.1 times the capacitance of the second resonator capacitor.

Configuration 14
The calculating device according to any one of Configurations 10 to 13, further comprising:
a controller,
the coupler further including a first magnetic field application part configured to apply a magnetic field to the space,
the controller being configured to change a magnetic flux in the space by controlling the first magnetic field application part.

Configuration 15
The calculating device according to Configuration 14, wherein
the first magnetic field application part includes a first conductive member, and
the controller changes the magnetic flux by modulating a current supplied to the first conductive member.

Configuration 16

The calculating device according to Configuration 14 or Configuration 15, wherein a two-qubit gate operation for the first and second nonlinear resonators is performed by the change of the magnetic flux.

Configuration 17

The calculating device according to Configuration 14 or Configuration 15, wherein the controller is configured to change a coupling strength between the first nonlinear resonator and the second nonlinear resonator by controlling the magnetic flux in the space.

Configuration 18

The calculating device according to Configuration 14 or Configuration 15, wherein the controller can substantially decouple the first nonlinear resonator from the second nonlinear resonator by controlling the magnetic flux in the space.

Configuration 19

The calculating device according to any one of Configurations 10 to 18, wherein the coupler can resonate in a plurality of modes, and resonant frequencies of the plurality of modes are not more than 2 times a resonant frequency of the first nonlinear resonator and not more than 2 times a resonant frequency of the second nonlinear resonator.

Configuration 20

The calculating device according to any one of Configurations 10 to 18, wherein the coupler can resonate in a plurality of modes, and resonant frequencies of the plurality of modes are higher than a resonant frequency of the first nonlinear resonator, higher than a resonant frequency of the second nonlinear resonator, and lower than a sum of the resonant frequency of the first nonlinear resonator and the resonant frequency of the second nonlinear resonator.

According to embodiments, a coupler and a calculating device can be provided in which the controllability can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in couplers and calculating devices such as nonlinear resonators, inductors, capacitors, conductive members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all couplers, and calculating devices practicable by an appropriate design modification by one skilled in the art based on the couplers, and the calculating devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A coupler, comprising:
a first capacitor including a first capacitor end portion and a first capacitor other-end portion;
a first inductor including
a first inductor end portion electrically connected with the first capacitor end portion, and
a first inductor other-end portion;
a second capacitor including a second capacitor end portion and a second capacitor other-end portion;
a second inductor including
a second inductor end portion electrically connected with the second capacitor end portion, and
a second inductor other-end portion electrically connected with the first capacitor other-end portion, the first inductor other-end portion, and the second capacitor other-end portion;
a first Josephson junction including
a first Josephson junction end portion electrically connected with the first capacitor end portion, and
a first Josephson junction other-end portion electrically connected with the second capacitor end portion,
a space being surrounded with the first inductor, the second inductor, and the first Josephson junction;
a third capacitor including
a third capacitor end portion electrically connectable with a first nonlinear resonator, and
a third capacitor other-end portion electrically connected with the first capacitor end portion; and
a fourth capacitor including
a fourth capacitor end portion electrically connectable with a second nonlinear resonator, and
a fourth capacitor other-end portion electrically connected with the second capacitor end portion.

2. The coupler according to claim 1, wherein
the first inductor includes a first conductive layer having a meandering structure, and
the second inductor includes a second conductive layer having a meandering structure.

3. The coupler according to claim 1, wherein
the first inductor includes a first inductor Josephson junction, and
the second inductor includes a second inductor Josephson junction.

4. The coupler according to claim 1, wherein
the first inductor includes a plurality of first inductor Josephson junctions,
the plurality of first inductor Josephson junctions is electrically connected in series to each other,
the second inductor includes a plurality of second inductor Josephson junctions, and
the plurality of second inductor Josephson junctions is electrically connected in series to each other.

5. The coupler according to claim 1, further comprising:
a fifth capacitor including a fifth capacitor end portion and a fifth capacitor other-end portion,
the fifth capacitor end portion being electrically connected with the first capacitor end portion, the fifth capacitor other-end portion being electrically connected with the second capacitor end portion.

6. The coupler according to claim 5, wherein a capacitance of the fifth capacitor is less than a capacitance of the first capacitor and less than a capacitance of the second capacitor.

7. The coupler according to claim 1, wherein capacitances of the first and second capacitors are greater than 0.1 times capacitances of the third and fourth capacitors.

8. The coupler according to claim 1, further comprising: a first conductive member configured to apply a magnetic field to the space,
a coupling strength between the first nonlinear resonator and the second nonlinear resonator changes according to magnetic flux in the space.

9. The coupler according to claim 1, wherein the coupler is capable of resonating in a plurality of modes,
at least two of resonant frequencies in the modes are higher than a resonant frequency of the first nonlinear resonator, are higher than a resonant frequency of the second nonlinear resonator, and are lower than a sum of the resonant frequency of the first nonlinear resonator and the resonant frequency of the second nonlinear resonator,
the first nonlinear resonator and the second nonlinear resonator can be substantially decoupled by controlling magnetic flux in the space, and
in a state of being substantially decoupled, the resonant frequencies in the modes are higher than the resonant frequency of the first nonlinear resonator, and are higher than the resonant frequency of the second nonlinear resonator.

10. The coupler according to claim 1, wherein the first nonlinear resonator consists of a first nonlinear resonator Josephson junction and a first resonator capacitor, and
the second nonlinear resonator consists of a second nonlinear resonator Josephson junction and a second resonator capacitor.

11. A calculating device, comprising:
the coupler according to claim 1;
the first nonlinear resonator; and
the second nonlinear resonator.

12. The device according to claim 11, wherein the first nonlinear resonator includes:
a first nonlinear resonator Josephson junction; and
a first resonator capacitor,
an end portion of the first nonlinear resonator Josephson junction and an end portion of the first resonator capacitor are electrically connected with the third capacitor end portion,
an other end portion of the first nonlinear resonator Josephson junction and an other end portion of the first resonator capacitor are electrically connected with the first capacitor other-end portion,
the second nonlinear resonator includes:
a second nonlinear resonator Josephson junction; and
a second resonator capacitor,
an end portion of the second nonlinear resonator Josephson junction and an end portion of the second resonator capacitor are electrically connected with the fourth capacitor end portion, and
an other end portion of the second nonlinear resonator Josephson junction and an other end portion of the second resonator capacitor are electrically connected with the second capacitor other-end portion.

13. The device according to claim 12, wherein a capacitance of the first capacitor is greater than 0.1 times a capacitance of the first resonator capacitor, and
a capacitance of the second capacitor is greater than 0.1 times a capacitance of the second resonator capacitor.

14. The device according to claim 13, wherein a capacitance of the third capacitor is greater than 0.1 times the capacitance of the first resonator capacitor, and
a capacitance of the fourth capacitor is greater than 0.1 times the capacitance of the second resonator capacitor.

15. The device according to claim 11, further comprising:
a controller,
the coupler further including a first magnetic field application part configured to apply a magnetic field to the space,
the controller being configured to change a magnetic flux in the space by controlling the first magnetic field application part.

16. The device according to claim 15, wherein the first magnetic field application part includes a first conductive member, and
the controller changes the magnetic flux by modulating a current supplied to the first conductive member.

17. The device according to claim 15, wherein a two-qubit gate operation for the first and second nonlinear resonators is performed by the change of the magnetic flux.

18. The device according to claim 15, wherein the controller is configured to change a coupling strength between the first nonlinear resonator and the second nonlinear resonator by controlling the magnetic flux in the space.

19. The device according to claim 15, wherein the controller can substantially decouple the first nonlinear resonator from the second nonlinear resonator by controlling the magnetic flux in the space.

20. The device according to claim 11, wherein the coupler is capable of resonating in a plurality of modes, and
resonant frequencies of the plurality of modes are not more than 2 times a resonant frequency of the first nonlinear resonator and not more than 2 times a resonant frequency of the second nonlinear resonator.

* * * * *